United States Patent
Bae et al.

(10) Patent No.: US 12,389,785 B2
(45) Date of Patent: Aug. 12, 2025

(54) DISPLAY DEVICE AND METHOD OF DRIVING DISPLAY DEVICE

(71) Applicant: Samsung Display Co., LTD., Yongin-si (KR)

(72) Inventors: Min-Seok Bae, Yongin-si (KR); Kanghee Lee, Yongin-si (KR); Changbin Im, Yongin-si (KR); Byung Ki Chun, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/506,642

(22) Filed: Nov. 10, 2023

(65) Prior Publication Data
US 2024/0260439 A1 Aug. 1, 2024

(30) Foreign Application Priority Data
Jan. 27, 2023 (KR) .......................... 10-2023-0010734

(51) Int. Cl.
*G09G 5/00* (2006.01)
*G09G 3/00* (2006.01)
(Continued)

(52) U.S. Cl.
CPC ............. *H10K 59/88* (2023.02); *G09G 3/006* (2013.01); *G09G 3/3233* (2013.01);
(Continued)

(58) Field of Classification Search
CPC ...... H10K 59/88; H10K 59/131; G09G 3/006; G09G 3/3233; G09G 2300/0426; G09G 2300/0439; G09G 2300/0819; G09G 2300/0852; G09G 2310/08; G09G 2320/045; G09G 2320/048; G09G 2330/12
(Continued)

(56) References Cited

U.S. PATENT DOCUMENTS

| 7,528,812 B2 | 5/2009 | Tsuge et al. |
| 2021/0210584 A1* | 7/2021 | Youn .................... H10K 59/121 |

(Continued)

FOREIGN PATENT DOCUMENTS

| JP | 4630535 B2 | 2/2011 |
| KR | 10-0805522 B1 | 2/2008 |

(Continued)

*Primary Examiner* — Jennifer T Nguyen
(74) *Attorney, Agent, or Firm* — Womble Bond Dickinson (US) LLP

(57) ABSTRACT

A display device includes: pixels in an active area, each of the pixels being electrically connected to a corresponding data line and a corresponding scan line; and a dummy pixel adjacent to at least one of the pixels, and electrically connected to the corresponding scan line and a sensing line. Each of the pixels and the dummy pixel includes: a light emitting element including a first electrode electrically connected to a first node, a second electrode, and an emission layer between the first electrode and the second electrode; a first transistor; a second transistor; a third transistor; a first capacitor; a fourth transistor; a fifth transistor; and a second capacitor. The dummy pixel further includes a sensing transistor electrically connected between the sensing line and the first node.

20 Claims, 15 Drawing Sheets

(51) Int. Cl.
*G09G 3/3233* (2016.01)
*H10K 59/131* (2023.01)
*H10K 59/88* (2023.01)

(52) U.S. Cl.
CPC ... *H10K 59/131* (2023.02); *G09G 2300/0426* (2013.01); *G09G 2300/0439* (2013.01); *G09G 2300/0819* (2013.01); *G09G 2300/0852* (2013.01); *G09G 2310/08* (2013.01); *G09G 2320/045* (2013.01); *G09G 2320/048* (2013.01); *G09G 2330/12* (2013.01)

(58) Field of Classification Search
USPC .......................................................... 345/214
See application file for complete search history.

(56) References Cited

U.S. PATENT DOCUMENTS

2022/0320245 A1\* 10/2022 Qu ...................... G09G 3/3233
2023/0197011 A1\* 6/2023 Hong .................. G09G 3/3233
                                                                                     345/212
2023/0343258 A1\* 10/2023 Matsueda .............. G09G 3/006

FOREIGN PATENT DOCUMENTS

| KR | 10-1837198 B1 | 3/2018 |
|---|---|---|
| KR | 10-2210589 B1 | 2/2021 |

\* cited by examiner

DISPLAY DEVICE AND METHOD OF DRIVING DISPLAY DEVICE

CROSS-REFERENCE TO RELATED APPLICATION

This application claims priority to and the benefit of Korean Patent Application No. 10-2023-0010734, filed on Jan. 27, 2023, in the Korean Intellectual Property Office, the entire disclosure of which is incorporated by reference herein.

BACKGROUND

Aspects of embodiments of the present disclosure relate to a display device having improved display quality, and a method of driving the display device.

A display device includes a plurality of pixels, and a driving circuit (e.g., a scan driving circuit and a data driving circuit) for controlling the plurality of pixels. Each of the plurality of pixels includes a display element, and a pixel driving circuit for controlling the display element. The pixel driving circuit may include a plurality of transistors that are organically connected to each other.

The scan driving circuit and/or the data driving circuit may be formed through the same process as that of the plurality of pixels. The scan driving circuit and/or the data driving circuit may include a plurality of transistors that are organically connected to each other.

The above information disclosed in this Background section is for enhancement of understanding of the background of the present disclosure, and therefore, it may contain information that does not constitute prior art.

SUMMARY

One or more embodiments of the present disclosure are directed to a display device having improved display quality by sensing degradation information of a pixel based on a dummy pixel, and compensating for a data signal of the pixel based on the degradation information. One or more embodiments of the present disclosure are directed to a method of driving the display device.

According to one or more embodiments of the present disclosure, a display device includes: a plurality of pixels in an active area, each of the plurality of pixels being electrically connected to a corresponding data line and a corresponding scan line; and a dummy pixel adjacent to at least one of the plurality of pixels, and electrically connected to the corresponding scan line and a sensing line. Each of the plurality of pixels and the dummy pixel includes: a light emitting element including a first electrode electrically connected to a first node, a second electrode, and an emission layer between the first electrode and the second electrode; a first transistor electrically connected between a first voltage line for receiving a first power supply voltage and the first node, the first transistor including a source, a drain, and a gate, the gate of the first transistor being electrically connected to a second node; a second transistor electrically connected between the corresponding data line and the second node; a third transistor electrically connected between the second node and a second voltage line for receiving a first voltage; a first capacitor electrically connected between the first node and the second node; a fourth transistor electrically connected between a third voltage line for receiving a second voltage and the first node; a fifth transistor electrically connected between the first voltage line and the first transistor; and a second capacitor electrically connected between the first voltage line and the first node. The dummy pixel further includes a sensing transistor electrically connected between the sensing line and the first node.

In an embodiment, the second electrode may include a first portion and a second portion spaced from the first portion. In a plan view, the first portion may overlap with the first electrode of each of the plurality of pixels, and the second portion may overlap with the first electrode of the dummy pixel.

In an embodiment, the first portion may be electrically connected to the first electrode of each of the plurality of pixels, and the second portion may be electrically connected to the first electrode of the dummy pixel.

In an embodiment, the first portion and the second portion may be electrically insulated from each other.

In an embodiment, the first portion may be configured to receive a second power supply voltage having a voltage level different from a voltage level of the first power supply voltage, and the second portion may be configured to receive the first power supply voltage.

In an embodiment, the light emitting element of the dummy pixel may be configured to not emit light.

In an embodiment, the dummy pixel may be located in the active area.

In an embodiment, the second transistor of the dummy pixel may include a gate electrode configured to receive a first scan signal; the third transistor of the dummy pixel may include a gate electrode configured to receive a compensation scan signal; the fourth transistor of the dummy pixel may include a gate electrode configured to receive an initialization scan signal; the fifth transistor of the dummy pixel may include a gate electrode configured to receive an emission signal; and the sensing transistor of the dummy pixel may include a gate electrode configured to receive a sensing signal.

In an embodiment, during a first operation period, the initialization scan signal and the compensation scan signal may be at an active level.

In an embodiment, during a second operation period following the first operation period, the emission signal and the compensation scan signal may be at the active level.

In an embodiment, during a third operation period following the second operation period, the first scan signal may be at the active level.

In an embodiment, during a fourth operation period following the third operation period, the emission signal and the sensing signal may be at the active level.

In an embodiment, the dummy pixel may include a plurality of dummy pixels, some of the plurality of dummy pixels may be configured to receive a first degradation signal, and others of the plurality of dummy pixels may be configured to receive a second degradation signal having a grayscale value different from a grayscale value of the first degradation signal.

In an embodiment, the plurality of pixels may include: a first pixel adjacent to the dummy pixel; and a second pixel spaced from the dummy pixel, with the first pixel located therebetween.

In an embodiment, the second electrode of each of the plurality of pixels and the dummy pixel may be configured to receive a second power supply voltage having a voltage level different from a voltage level of the first power supply voltage.

In an embodiment, the display device may further include a black matrix layer over the first pixel and the dummy pixel, and overlapping with the first pixel and the dummy pixel in a plan view.

In an embodiment, the display device may further include a pixel defining layer covering the emission layer of each of the first pixel and the dummy pixel, the pixel defining layer having an opening corresponding to the emission layer of the second pixel.

According to one or more embodiments of the present disclosure, a display device driving method includes: providing a display device including: a plurality of pixels, each including a driving transistor; a dummy pixel including: a driving transistor; a sensing transistor connected to the driving transistor of the dummy pixel; and a sensing line connected to the sensing transistor; and a degradation sensing circuit; degrading the dummy pixel during a degradation time; and measuring degradation information of the dummy pixel through the sensing line.

In an embodiment, the degradation time may be 100 hours.

In an embodiment, in the degrading of the dummy pixel, the sensing line may be electrically insulated from the degradation sensing circuit, and in the measuring of the degradation information, the sensing line may be electrically connected to the degradation sensing circuit.

BRIEF DESCRIPTION OF THE FIGURES

The above and other aspects and features of the present disclosure will be more clearly understood from the following detailed description of the illustrative, non-limiting embodiments with reference to the accompanying drawings.

DETAILED DESCRIPTION

Figure 1:
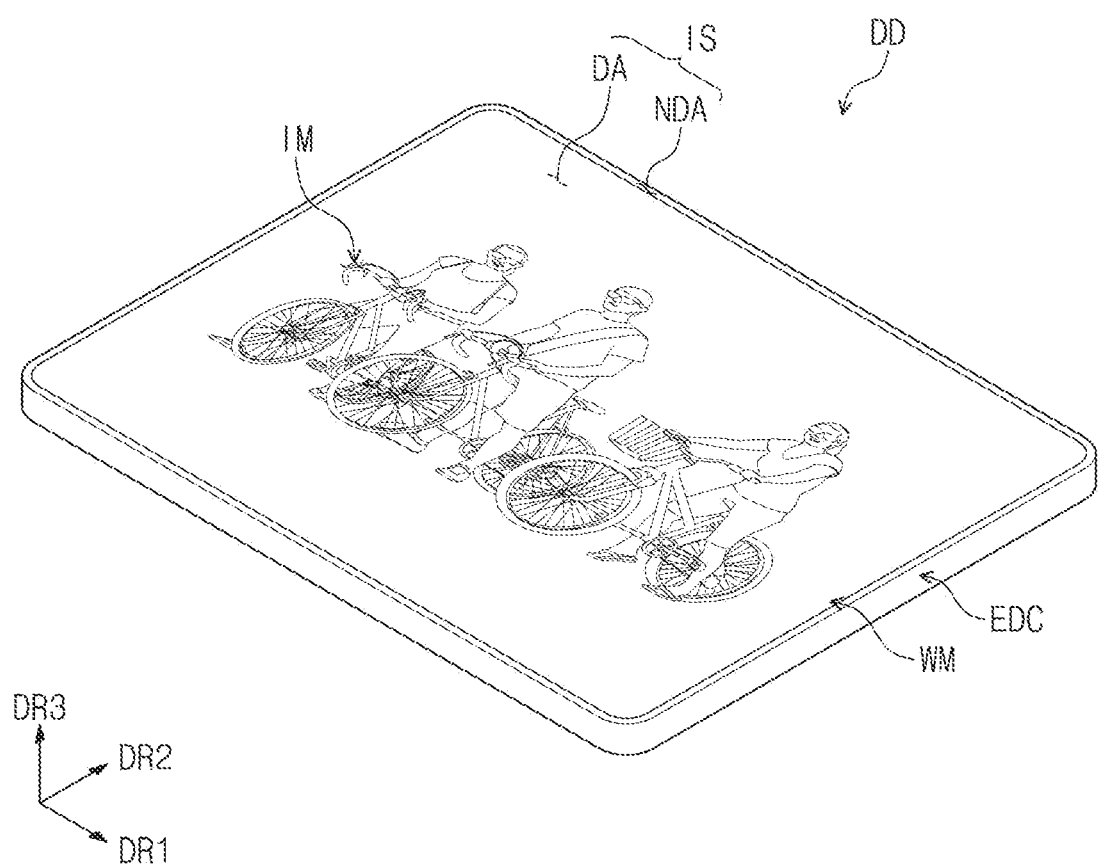
FIG. 1 is a perspective view illustrating a display device according to an embodiment of the present disclosure.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to"

another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
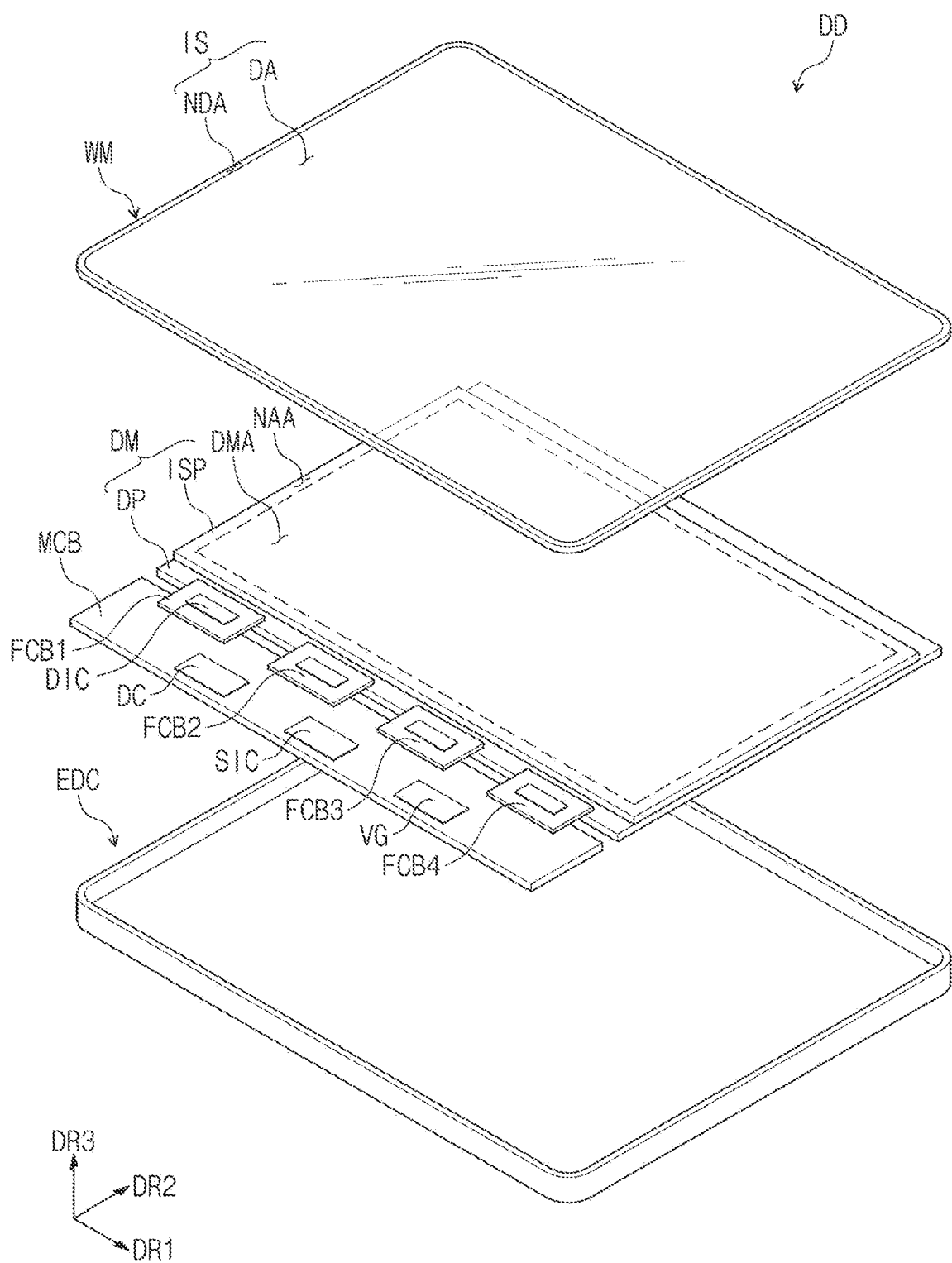
FIG. 2 is an exploded perspective view of a display device according to an embodiment of the present disclosure.

FIG. 1 is a perspective view illustrating a display device according to an embodiment of the present disclosure. FIG. 2 is an exploded perspective view of a display device according to an embodiment of the present disclosure.

Referring to FIGS. 1 and 2, the display device DD may refer to a device that displays an image IM depending on an electrical signal. In an embodiment of the present disclosure, the display device DD may be implemented with an independent device. In an embodiment of the present disclosure, the display device DD may include a small and/or medium-sized electronic device, such as a mobile phone, a tablet, a notebook, an automotive navigation system, or a game console, as well as a large-sized electronic device, such as a television or a monitor.

The display device DD may be in the shape of a rectangle having a long edge (or long side) in (e.g., extending in) a first direction DR1, and a short edge (or short side) in a second direction DR2 crossing (e.g., intersecting) the first direction DR1. However, the shape of the display device DD is not limited thereto. For example, the display device DD may be implemented in various suitable shapes (e.g., another polygonal shape, a circular shape, an elliptical shape, or the like). The display device DD may display the image IM on a display surface IS parallel to or substantially parallel to each of the first direction DR1 and the second direction DR2, so as to face toward a third direction DR3. The third direction DR3 may be a direction crossing (e.g., intersecting) the first direction DR1 and the second direction DR2. The display surface IS on which the image IM is displayed may correspond to a front surface of the display device DD.

In an embodiment, a front surface (e.g., an upper/top surface) and a rear surface (e.g., a lower/bottom surface) of each member may be defined with respect to a direction in which the image IM is displayed. The front surface and the rear surface may be opposite to each other in the third direction DR3, and a normal direction of each of the front surface and the rear surface may be parallel to or substantially parallel to the third direction DR3.

A separation distance between the front surface and the rear surface in the third direction DR3 may correspond to a thickness of the display device DD in the third direction DR3. However, the first, second, and third directions DR1, DR2, and DR3 may indicate relative directions and may be changed to different suitable directions as needed or desired.

In an embodiment, the display device DD may sense an external input that is applied from the outside. The external input may include various suitable kinds of inputs that are provided from the outside of the display device DD. The display device DD according to an embodiment of the present disclosure may sense an external input of a user, which is applied from the outside. The external input of the user may be one of various suitable kinds of external inputs, such as a part of the user's body, the user's eyes, light, heat, pressure, and/or a suitable combination thereof. Also, the display device DD may sense the external input of the user applied to the side surface and/or the rear surface of the display device DD depending on a desired structure of the display device DD, and is not limited to any one particular embodiment. As an example, the external input may include an input that is applied by using an input device (e.g., a stylus pen, an active pen, a touch pen, an electronic pen, or an E-pen).

The display surface IS of the display device DD may include a display area DA and a non-display area NDA. The display area DA may refer to an area in which the image IM is displayed. The user may visually perceive the image IM through the display area DA. In an embodiment, the display area DA is illustrated in the shape of a quadrangle having vertexes that are rounded. However, the present disclosure is not limited thereto, and the display area DA may have various suitable shapes, and is not limited to any one particular embodiment.

The non-display area NDA may surround (e.g., around a periphery of) the display area DA. The non-display area NDA may have a suitable color (e.g., a given or predetermined color). As such, the shape of the display area DA may be defined by or substantially by the non-display area NDA. However, the present disclosure is not limited thereto. The non-display area NDA according to an embodiment of the present disclosure may be disposed to be adjacent to only one or more sides of the display area DA, or may be omitted as needed or desired. The display device DD may include various embodiments of the present disclosure, and is not limited to any one particular embodiment.

The display device DD may include a display module (e.g., a display or a touch-display) DM, and a window WM disposed on and/or over the display module DM. The display module DM may include a display panel DP and an input sensing layer ISP.

The display panel DP according to an embodiment of the present disclosure may be a light emitting display panel, but is not particularly limited thereto. For example, the display panel DP may be an organic light emitting display panel, a quantum dot light emitting display panel, a micro-LED display panel, or a nano-LED display panel. An emission layer of the organic light emitting display panel may include an organic light-emitting material. An emission layer of the quantum dot light emitting display panel may include a quantum dot, a quantum rod, and/or the like. An emissive layer of the micro-LED display panel may include a micro-LED. An emissive layer of the nano-LED display panel may include a nano-LED. Hereinafter, for convenience sake, the display panel DP may be described in more detail in the context of the organic light emitting display panel.

The display panel DP may output the image IM, and the output image IM may be displayed through the display surface IS.

The input sensing layer ISP may be disposed on the display panel DP to sense an external input. The input sensing layer ISP may be directly disposed on the display panel DP. According to an embodiment of the present disclosure, the input sensing layer ISP may be formed on the display panel DP through a subsequent process. In other words, in a case where the input sensing layer ISP is directly disposed on the display panel DP, an inner adhesive film is not interposed between the input sensing layer ISP and the display panel DP. In another embodiment, an inner adhesive film may be interposed between the input sensing layer ISP and the display panel DP. In this case, the input sensing layer ISP is not manufactured by a process subsequent to that of the display panel DP. In other words, the input sensing layer ISP may be manufactured through a process that is independent of that of the display panel DP, and may then be fixed on (e.g., connected to or attached to) an upper surface of the display panel DP by the inner adhesive film and/or the like.

The window WM may be formed of a transparent material capable of outputting the image IM (e.g., transmitting the image IM therethrough). For example, the window WM may be formed of glass, sapphire, plastic, and/or the like. An example in which the window WM is implemented with a single layer is illustrated, but the present disclosure is not limited thereto. For example, the window WM may include a plurality of layers.

In an embodiment, the window WM may include a light blocking pattern for defining the non-display area NDA. The light blocking pattern may be formed as a colored organic film, for example, in a coating manner.

The window WM may be coupled to (e.g., connected to or attached to) the display module DM by an adhesive film. In an example, the adhesive film may include an optically clear adhesive (OCA) film. However, the adhesive film is not limited thereto. For example, the adhesive film may include a typical adhesive or a sticking agent. For example, the adhesive film may include an optically clear resin (OCR) film or a pressure sensitive adhesive (PSA) film.

An anti-reflection layer may be further interposed between the window WM and the display module DM. The anti-reflection layer may reduce the reflectance of external light incident from above the window WM. The anti-reflection layer according to an embodiment of the present disclosure may include a retarder and a polarizer. The retarder may be of a film type or a liquid crystal coating type. The polarizer may also be of a film type or a liquid crystal coating type. The polarizer of the film type may include a stretch-type synthetic resin layer, and the polarizer of the liquid crystal coating type may include liquid crystals arranged in a suitable direction (e.g., a given or predetermined direction). The retarder and the polarizer may be implemented with one polarization film.

As an example, the anti-reflection layer may also include color filters. The arrangement of the color filters may be determined in consideration of the colors of light that a plurality of pixels PX11 to PXnm (e.g., refer to FIG. 3) included in the display panel DP generates. The anti-reflection layer may further include a light blocking pattern.

The display module DM may display the image IM depending on an electrical signal, and may transmit/receive information about an external input. An active area DMA and a peripheral area NAA may be defined in the display module DM.

The active area DMA may be defined as an area where the image IM provided from the display module DM is output. Also, the active area DMA may be defined as an area where the input sensing layer ISP senses an external input applied from the outside.

The peripheral area NAA may be adjacent to the active area DMA. For example, the peripheral area NAA may surround (e.g., around a periphery of) the active area DMA. However, the present disclosure is not limited thereto. For example, the peripheral area NAA may be defined in various suitable shapes, and is not limited to any one particular embodiment. According to an embodiment, the active area DMA of the display module DM may correspond to (e.g., may overlap with) at least a portion of the display area DA.

The display module DM may further include a main circuit board MCB, and flexible circuit films FCB1, FCB2, FCB3, and FCB4. The main circuit board MCB may be connected to the flexible circuit films FCB1, FCB2, FCB3, and FCB4, so as to be electrically connected to the display panel DP. The flexible circuit films FCB1, FCB2, FCB3, and FCB4 are connected to the display panel DP to electrically connect the display panel DP and the main circuit board MCB to each other. Four flexible circuit films FCB1, FCB2, FCB3, and FCB4 are illustrated in FIG. 2 as an example, but the number of flexible circuit films according to various embodiments of the present disclosure may be variously modified without limitation to a particular number.

A data driving circuit DIC may be mounted on each of the flexible circuit films FCB1, FCB2, FCB3, and FCB4. The data driving circuit DIC may provide a data signal to the display panel DP.

The display module DM may include a driving controller DC, a degradation sensing circuit SIC, and a voltage generator VG, which may be disposed on the main circuit board MCB.

The driving controller DC may include circuits for driving the display panel DP. The driving controller DC may control the data driving circuit DIC.

The degradation sensing circuit SIC may receive a sensing signal from dummy pixels DX1 to DXn (e.g., refer to FIG. 3) disposed in the display panel DP, and may determine a degree of degradation of the plurality of pixels PX11 to PXnm based on the sensing signal. This will be described in more detail below.

The voltage generator VG may generate voltages used for an operation of the display panel DP.

The driving controller DC, the degradation sensing circuit SIC, and the voltage generator VG may each be implemented with one or more independent integrated circuits, and may be mounted on the main circuit board MCB. In an embodiment of the present disclosure, the driving controller DC and the degradation sensing circuit SIC may be implemented (e.g., may be implemented together) with a single circuit.

The input sensing layer ISP may be electrically connected to the main circuit board MCB through the flexible circuit films FCB1, FCB2, FCB3, and FCB4. However, the present disclosure is not limited thereto. The connection relationship of the input sensing layer ISP according to the present disclosure is not limited thereto. For example, the display module DM may additionally include a separate flexible circuit film for electrically connecting the input sensing layer ISP and the main circuit board MCB to each other.

The display device DD may further include an outer case EDC for accommodating the display module DM. The outer case EDC may be coupled to (e.g., connected to or attached to) the window WM to define the exterior of the display device DD. The outer case EDC may absorb shocks from the outside, and may prevent or substantially prevent a material/moisture or the like from being infiltrated into the display module DM, such that components accommodated in the outer case EDC are protected. As an example, the outer case EDC may be implemented by coupling (e.g., connecting or attaching) a plurality of accommodating members to one another.

Figure 3:
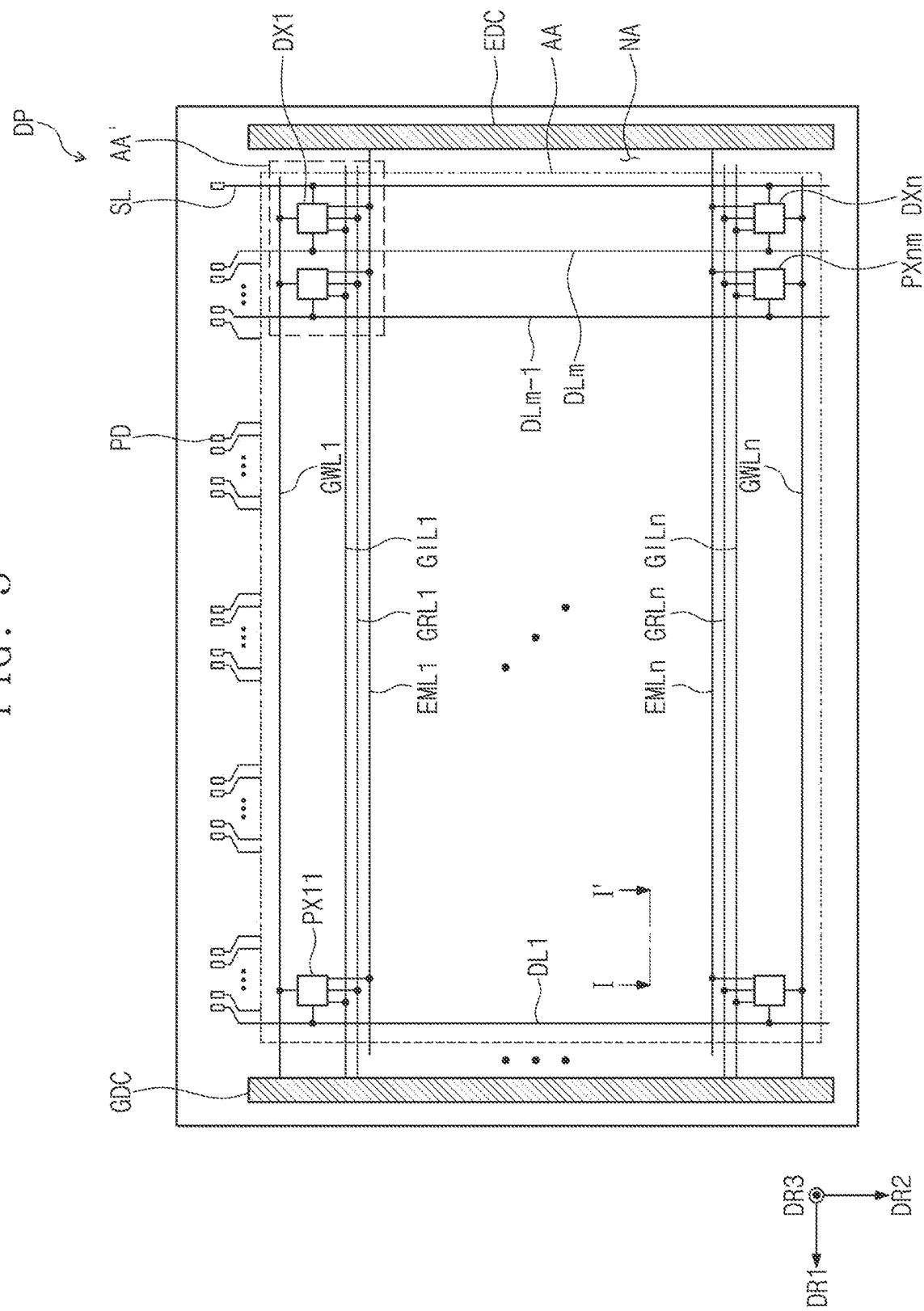
FIG. 3 is a plan view of a display panel according to an embodiment of the present disclosure.

FIG. 3 is a plan view of a display panel according to an embodiment of the present disclosure.

Referring to FIG. 3, an active area AA and a peripheral area NA adjacent to the active area AA may be defined in the display panel DP. The active area AA and the peripheral area NA may be distinguished from each other depending on whether or not the plurality of pixels PX11 to PXnm are disposed. The plurality of pixels PX11 to PXnm may be disposed in the active area AA, and may not be disposed in the peripheral area NA.

The active area AA of the display panel DP may overlap with the active area DMA (e.g., refer to FIG. 2) of the display module DM. The peripheral area NA of the display panel DP may overlap with the peripheral area NAA (e.g., refer to FIG. 2) of the display module DM.

The display panel DP may include the plurality of pixels PX11 to PXnm, a scan driving circuit GDC, an emission driving circuit EDC, the plurality of dummy pixels DX1 to DXn, scan lines GIL1 to GILn, GRL1 to GRLn, and GWL1 to GWLn, emission lines EML1 to EMLn, data lines DL1 to DLm−1 and DLm, and a sensing line SL. Here, each of "n" and "m" may be a natural number of 2 or more.

The plurality of pixels PX11 to PXnm and the plurality of dummy pixels DX1 to DXn may be disposed in the active area AA. Each of the plurality of pixels PX11 to PXnm and the plurality of dummy pixels DX1 to DXn may be electrically connected to three scan lines and one emission line. For example, as illustrated in FIG. 3, the pixels in a first row may be connected to the scan lines GIL1, GRL1, and GWL1, and the emission line EML1. The pixels in an i-th row may be connected to the scan lines GILi, GRLi, and GWLi, and the emission line EMLi.

Each of the plurality of pixels PX11 to PXnm includes a light emitting element ED (e.g., refer to FIG. 4), and a pixel circuit for controlling the emission of the light emitting element ED. The pixel circuit may include one or more transistors and one or more capacitors. The scan driving circuit GDC and the emission driving circuit EDC may include transistors formed through the same or substantially the same process as that of the pixel circuit.

The plurality of dummy pixels DX1 to DXn may be disposed to be adjacent to the plurality of pixels PX11 to PXnm. The plurality of dummy pixels DX1 to DXn may be spaced apart from the plurality of pixels PX11 to PXnm in the first direction DR1. The plurality of dummy pixels DX1 to DXn may be arranged along a direction opposite to (e.g., facing away from) the second direction DR2. However, the present disclosure is not limited thereto, and the arrangement of the plurality of dummy pixels DX1 to DXn according to the present disclosure is not limited thereto. For example, the plurality of dummy pixels DX1 to DXn may be arranged along the first direction DR1.

Each of the plurality of dummy pixels DX1 to DXn may be electrically connected to the sensing line SL.

The scan driving circuit GDC is disposed in the peripheral area NAA of the display panel DP, so as to be adjacent to the active area AA. The scan lines GIL1 to GILn, GRL1 to GRLn, and GWL1 to GWLn may extend from the scan driving circuit GDC in a direction opposite to (e.g., facing away from) the first direction DR1.

The scan driving circuit GDC may receive a scan control signal from the driving controller DC (e.g., refer to FIG. 2). The scan driving circuit GDC may output scan signals to the scan lines GIL1 to GILn, GRL1 to GRLn, and GWL1 to GWLn in response to the scan control signal.

The emission driving circuit EDC is disposed in the peripheral area NAA of the display panel DP, so as to be adjacent to the active area AA. In an embodiment, the emission lines EML1 to EMLn may extend from the emission driving circuit EDC in the first direction DR1.

The emission driving circuit EDC may receive an emission control signal from the driving controller DC (e.g., refer to FIG. 3). The emission driving circuit EDC may output emission signals to the emission lines EML1 to EMLn in response to the emission control signal.

The scan lines GIL1 to GILn, GRL1 to GRLn, and GWL1 to GWLn and the emission lines EML1 to EMLn are arranged to be spaced apart from each other in the second direction DR2.

In the example illustrated in FIG. 3, the scan driving circuit GDC and the emission driving circuit EDC are arranged to face each other, with the plurality of pixels PX11 to PXnm interposed therebetween. However, the present disclosure is not limited thereto. For example, each of the scan driving circuit GDC and the emission driving circuit EDC may be disposed in the peripheral area NAA adjacent to the active area AA of the display panel DP, so as to be adjacent to each other. In an embodiment, the scan driving circuit GDC and the emission driving circuit EDC may be implemented (e.g., implemented together) with one circuit.

The data lines DL1 to DLm−1 and DLm may extend in the second direction DR2, and may be arranged to be spaced apart from each other in the first direction DR1.

Some data lines DL1 to DLm−1 of the data lines DL1 to DLm−1 and DLm may receive data signals from the data driving circuit DIC (e.g., refer to FIG. 2). The data lines DL1 to DLm−1 may be connected to the plurality of pixels PX11 to PXnm.

The other remaining data line DLm from among the data lines DL1 to DLm−1 and DLm may receive a test data signal from the data driving circuit DIC (e.g., refer to FIG. 2). The remaining data line DLm may be connected to the plurality of dummy pixels DX1 to DXn.

The data driving circuit DIC (e.g., refer to FIG. 2) may convert a signal received from the driving controller DC to a data signal. The data driving circuit DIC (e.g., refer to FIG. 2) may be electrically connected to the plurality of pixels PX11 to PXnm and the plurality of dummy pixels DX1 to DXn through pads PD disposed in the peripheral area NA.

Figure 4:
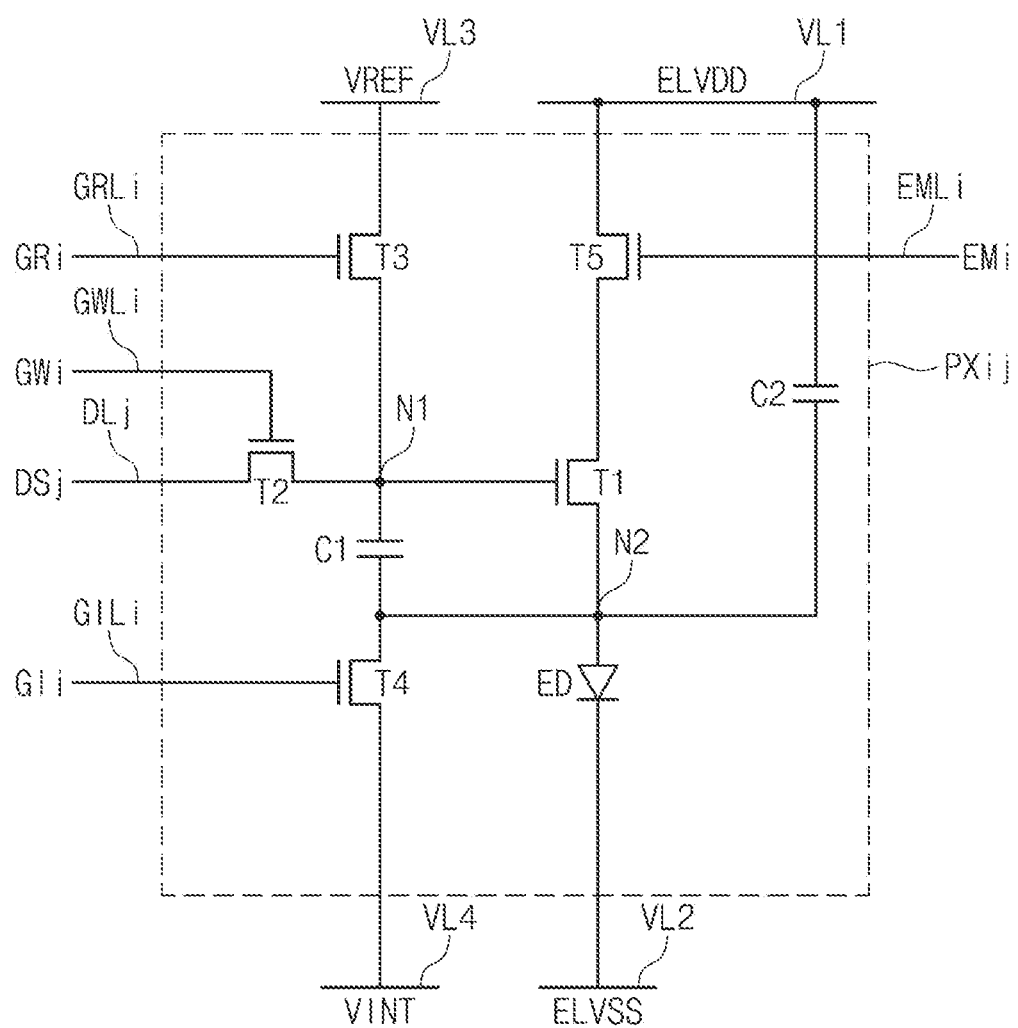
FIG. 4 is an equivalent circuit diagram of a pixel according to an embodiment of the present disclosure.
Figure 5:
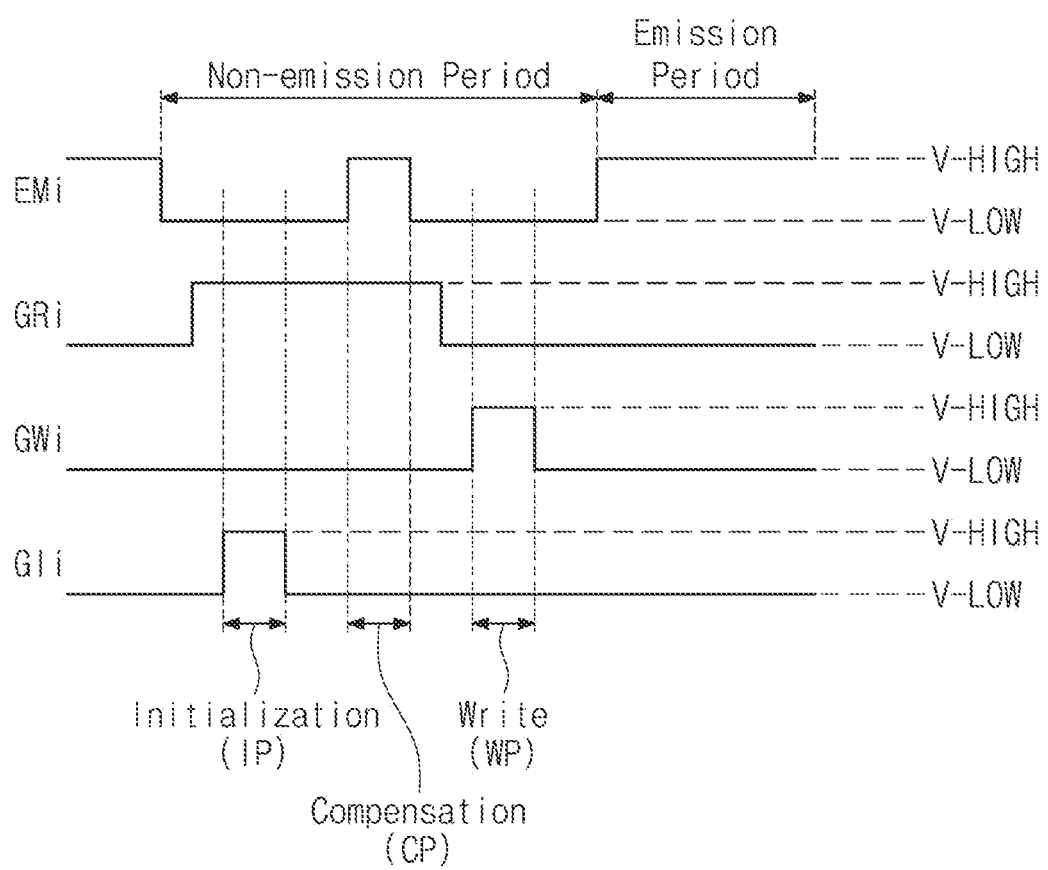
FIG. 5 is a waveform diagram of driving signals for driving the pixel illustrated in FIG. 4, according to an embodiment of the present disclosure.

FIG. 4 is an equivalent circuit diagram of a pixel according to an embodiment of the present disclosure. FIG. 5 is a waveform diagram of driving signals for driving the pixel illustrated in FIG. 4, according to an embodiment of the present disclosure.

A pixel PXij connected to the i-th scan lines GILi, GRLi, and GWLi from among the scan lines GIL1 to GILn, GRL1 to GRLn, and GWL1 to GWLn (e.g., refer to FIG. 3), the i-th emission line EMLi from among the emission lines EML1 to EMLn, and the j-th data line DLj from among the data lines DL1 to DLm is illustrated in FIG. 4 as an example. Here, "i" may have a value from 1 to n, and "j" may have a value from 1 to (m−1).

Referring to FIGS. 4 and 5, the pixel PXij according to an embodiment of the present disclosure may include a pixel circuit, and at least one light emitting element ED. The pixel circuit may include first to fifth transistors T1, T2, T3, T4, and T5, a first capacitor C1, and a second capacitor C2.

In an embodiment, each of the first to fifth transistors T1 to T5 may be an N-type transistor using an oxide semiconductor as a semiconductor layer. However, the present disclosure is not limited thereto. For example, each of the first to fifth transistors T1 to T5 may be a P-type transistor having a low-temperature polycrystalline silicon (LTPS) semiconductor layer. In another embodiment, at least one of the first to fifth transistors T1 to T5 may be an N-type transistor, and the other remaining transistors may be P-type transistors. Also, the circuit configuration of the pixel PXij according to the present disclosure is not limited to that illustrated in FIG. 4. The number of transistors included in the pixel PXij, the number of capacitors included in the pixel PXij, and the connection relationships thereof may be variously changed or modified as needed or desired.

The scan lines GILi, GRLi, and GWLi may respectively transfer scan signals GIi, GRi, and GWi, and the emission line EMLi may transfer an emission signal EMi. The data line DLj may transfer a data signal DSj. The data signal DSj may have a voltage level corresponding to an image signal output from the driving controller DC (e.g., refer to FIG. 2).

The voltage generator VG (e.g., refer to FIG. 2) generates voltages used for the operation of the display panel DP. In an embodiment, the voltage generator VG (e.g., refer to FIG. 2) may generate a first power supply voltage ELVDD, a second power supply voltage ELVSS having a voltage level lower than that of the first power supply voltage ELVDD, a reference voltage VREF, and an initialization voltage VINT.

First to fourth voltage lines VL1, VL2, VL3, and VL4 may transfer the first power supply voltage ELVDD, the second power supply voltage ELVSS, the reference voltage VREF, and the initialization voltage VINT, respectively.

The light emitting element ED may be connected between a second node N2 and the second voltage line VL2. The light emitting element ED may include a first electrode electrically connected to the second node N2, a second electrode CE (e.g., refer to FIG. 6) for receiving the second power supply voltage ELVSS, and an emission layer interposed between the first electrode and the second electrode CE.

The first transistor T1 may be electrically connected between the first voltage line VL1 and the second node N2. The first transistor T1 may include a source, a drain, a channel region, and a gate electrode. The gate electrode of the first transistor T1 may be connected to a first node N1. The first transistor T1 may be connected between the fifth transistor T5 and the second node N2. The first transistor T1 may be referred to as a "driving transistor".

The second transistor T2 may be connected between the data line DLj and the first node N1. The second transistor T2 may include a source, a drain, a channel region, and a gate electrode. The gate electrode of the second transistor T2 may be connected to the scan line GWLi. The gate electrode of the second transistor T2 may receive the first scan signal GWi from the scan line GWLi. The second transistor T2 may be referred to as a "switching transistor".

The third transistor T3 may be connected between the third voltage line VL3 and the first node N1. The third transistor T3 may include a source, a drain, a channel region, and a gate electrode. The gate electrode of the third transistor T3 may be connected to the scan line GRLi. The gate electrode of the third transistor T3 may receive a compensation scan signal GRi from the scan line GRLi.

The fourth transistor T4 may be connected between the second node N2 and the fourth voltage line VL4. The fourth transistor T4 may include a source, a drain, a channel region, and a gate electrode. The gate electrode of the fourth transistor T4 may be connected to the scan line GILi. The gate electrode of the fourth transistor T4 may receive an initialization scan signal GIi from the scan line GILi.

The fifth transistor T5 may be connected between the first voltage line VL1 and the first transistor T1. The fifth transistor T5 may include a source, a drain, a channel region, and a gate electrode. The gate electrode of the fifth transistor T5 may be connected to the emission line EMLi. The gate electrode of the fifth transistor T5 may receive the emission signal EMi from the emission line EMLi.

The first capacitor C1 may be connected between the first node N1 and the second node N2.

The second capacitor C2 may be connected between the first voltage line VL1 and the second node N2.

The display panel DP (e.g., refer to FIG. 3) may display the image IM every frame period. Signal lines of each of a first group of scan lines, of each of a second group of scan lines, of each of a third ground of scan lines, and of each of the emission lines may be sequentially scanned during the frame period. FIG. 5 shows a portion of the frame period.

The frame period may include a non-emission period, and an emission period continuous to (e.g., continuing from an end of) the non-emission period. The non-emission period may include an initialization period IP, a compensation period CP, and a write period WP that are continuous from each other.

Each of the signals EMi, GRi, GWi, and GIi may have a high level V-HIGH during some periods, and a low level V-LOW during the other remaining periods. Each of the first to fifth transistors T1 to T5, which may be N-type transistors as described above, may be turned on when the corresponding control signal has the high level V-HIGH. For example, in the case of an N-type transistor, the high level V-HIGH may be referred to as an "active level", and the low level V-LOW may be referred to as an "inactive level". In the case of a P-type transistor, a low level may be referred to as an "active level", and a high level may be referred to as an "inactive level".

During the initialization period IP, the initialization scan signal GIi and the compensation scan signal GRi may be at the active level, and the emission signal EMi and the first scan signal GWi may be at the inactive level. The third transistor T3 and the fourth transistor T4 may be turned on. The first node N1 may be initialized with the reference voltage VREF. The second node N2 may be initialized with the initialization voltage VINT. The first capacitor C1 may be initialized with a difference value of the reference voltage VREF and the initialization voltage VINT. The second capacitor C2 may be initialized with a difference value of the first power supply voltage ELVDD and the initialization voltage VINT.

During the compensation period CP, the emission signal EMi and the compensation scan signal GRi may be at the active level, and the first scan signal GWi and the initialization scan signal GIi may be at the inactive level. The third transistor T3 and the fifth transistor T5 may be turned on. A voltage corresponding to the threshold voltage of the first transistor T1 may be compensated for in the first capacitor C1.

During the write period WP, the first scan signal GWi may be at the active level, and the emission signal EMi, the compensation scan signal GRi, and the initialization scan signal GIi may be at the inactive level. The second transistor T2 may be turned on. The second transistor T2 may output a voltage corresponding to the data signal DSj. As a result, a voltage value corresponding to the data signal DSj may be charged in the first capacitor C1. The data signal DSj that experiences the compensation for the threshold voltage of the first transistor T1 may be charged in the first capacitor C1.

Threshold voltages of the driving transistors of the pixels PX11 to PXnm may be different from each other. However, according to one or more embodiments of the present disclosure, as the compensation operation is performed in the compensation period CP, the pixel PXij may provide the light emitting element ED with a current having a magnitude that is proportional to the data signal DSj, regardless of the threshold voltage difference of the driving transistors of the pixels PX11 to PXnm. In this case, the display quality of the pixel PXij may be improved. Accordingly, the display device DD (e.g., refer to FIG. 1) having an improved display quality may be provided.

Afterwards, during the emission period, the emission signal EMi may be at the active level, and the compensation scan signal GRi, the first scan signal GWi, and the initialization scan signal GIi may be at the inactive level. The fifth transistor T5 may be turned on. The first transistor T1 may provide the light emitting element ED with the current corresponding to the voltage stored in the first capacitor C1. The light emitting element ED may emit a light having a desired luminance corresponding to the data signal DSj.

Figure 6:
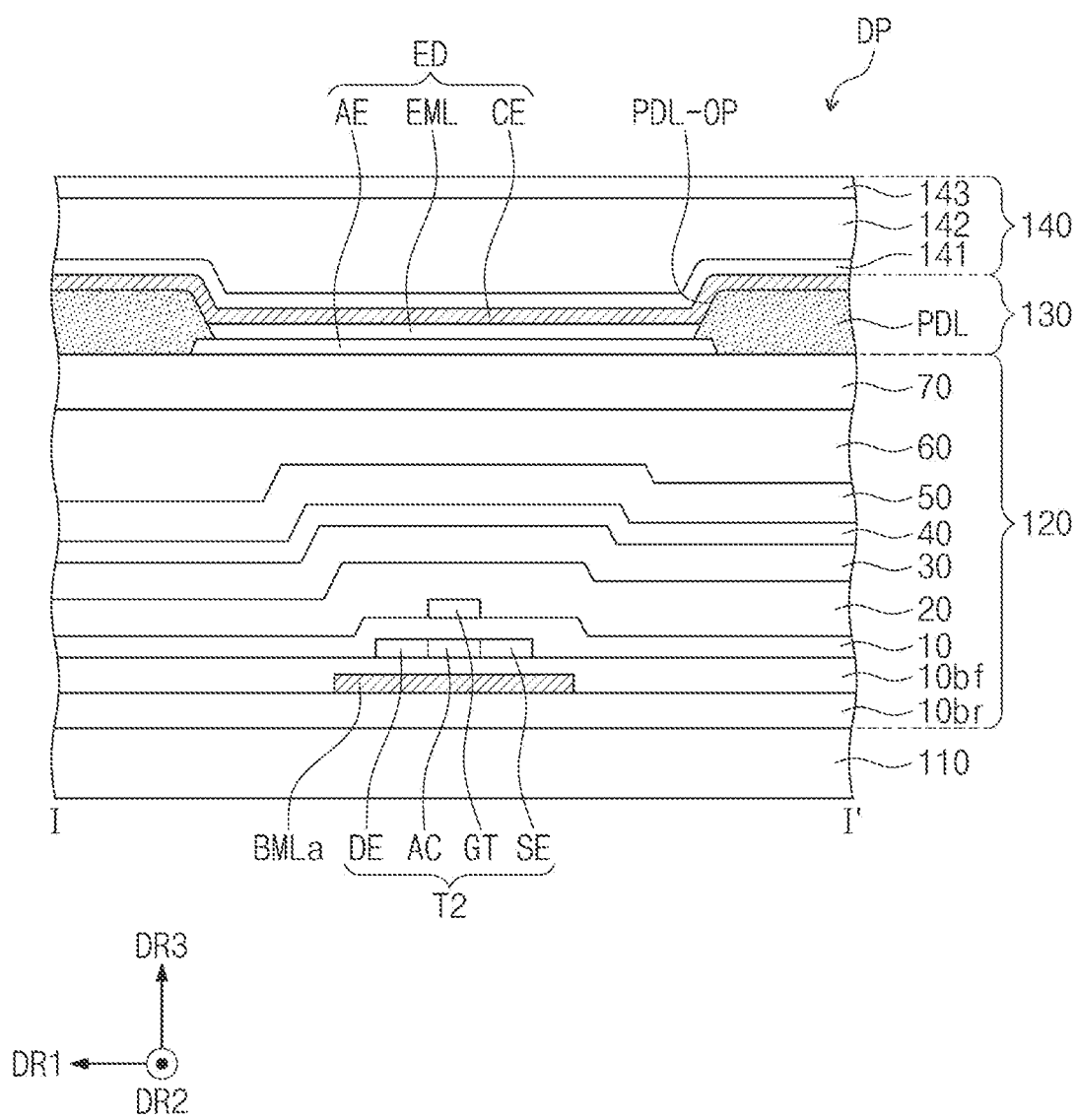
FIG. 6 is a cross-sectional view of a display panel taken along the line I-I' of FIG. 3, according to an embodiment of the present disclosure.

FIG. 6 is a cross-sectional view of a display panel taken along the line I-I' of FIG. 3, according to an embodiment of the present disclosure.

The second transistor T2 and the light emitting element ED illustrated in FIG. 4 are shown in more detail in FIG. 6 as an example.

Referring to FIG. 6, the display panel DP may include a base layer 110, a circuit layer 120, a light emitting element layer 130, and an encapsulation layer 140.

The base layer 110 may provide a base surface on which the circuit layer 120 is disposed. The base layer 110 may be a flexible substrate that may be bent, folded, or rolled. The base layer 110 may be a glass substrate, a metal substrate, a polymer substrate, and/or the like. However, the present disclosure is not limited thereto, and the base layer 110 may be an inorganic layer, an organic layer, or a composite material layer.

The base layer 110 may include a plurality of layers. For example, the base layer 110 may include a first synthetic resin layer, an inorganic layer having a multi-layered structure or a single-layer structure, and a second synthetic resin layer disposed on the inorganic layer of the multi-layered structure or the single-layer structure. Each of the first synthetic resin layer and the second synthetic resin layer may include a polyimide-based resin, but is not particularly limited thereto.

The circuit layer 120 may be disposed on the base layer 110. The circuit layer 120 may include a barrier layer 10*br*, a buffer layer 10*bf*, first to seventh insulating layers 10 to 70, a semiconductor pattern, a conductive pattern, a signal line, and the like.

The barrier layer 10*br* may be disposed on the base layer 110. The barrier layer 10*br* prevents or substantially prevents foreign objects from being introduced from the outside. The barrier layer 10*br* may include at least one inorganic layer. For example, the barrier layer 10*br* may include a silicon oxide layer and/or a silicon nitride layer. Each of the silicon oxide layer and the silicon nitride layer may be provided in a plurality, and the plurality of silicon oxide layers and the plurality of silicon nitride layers may be alternately stacked.

A first shielding electrode BMLa may be disposed on the barrier layer 10*br*. The first shielding electrode BMLa may include a suitable metal. The first shielding electrode BMLa may include molybdenum (Mo), an alloy containing molybdenum, titanium (Ti), or an alloy containing titanium, which may have good heat resistance. The first shielding electrode BMLa may receive a bias voltage. The first shielding electrode BMLa may receive the first power supply voltage ELVDD (e.g., refer to FIG. 4). The first shielding electrode BMLa may prevent or substantially prevent an electrical potential due to a polarization phenomenon from affecting the second transistor T2. The first shielding electrode BMLa may prevent or substantially prevent external light from being incident onto the second transistor T2. The first shielding electrode BMLa may be a floating electrode that is isolated from any other electrode or wire. In other words, the first shielding electrode BMLa may be electrically floated.

The buffer layer 10*bf* may be disposed on the barrier layer 10*br*, and may cover the first shielding electrode BMLa. The buffer layer 10*bf* may prevent or substantially prevent metal atoms or impurities from being spread from the base layer 110 into a semiconductor layer disposed thereon. The buffer layer 10*bf* may include at least one inorganic layer. The buffer layer 10*bf* may include a silicon oxide layer and/or a silicon nitride layer.

The semiconductor layer may be disposed on the buffer layer 10*bf*. The semiconductor layer may include a silicon semiconductor. For example, the silicon semiconductor may include amorphous silicon or polycrystalline silicon. The semiconductor layer may include a low-temperature polycrystalline silicon (LTPS).

An electrical property of the semiconductor layer may vary depending on whether it is doped or not. The semiconductor layer may include a first region having a relatively higher conductivity, and a second region having a relatively lower conductivity. The first region may be doped with an N-type dopant or a P-type dopant. The first region for a P-type transistor may be doped with a P-type dopant, and the first region for an N-type transistor may be doped with an N-type dopant. The second region may be a region that is not doped, or may be a region doped to have a concentration lower than the concentration of the first region.

The conductivity of the first region may be higher than the conductivity of the second region, and the first region may serve or substantially serve as an electrode or a signal line. The second region may correspond to or substantially correspond to a channel region (e.g., an active region) of a transistor. A source SE, the channel region (e.g., the active region) AC, and a drain DE of the second transistor T2 may be formed from the semiconductor layer. The source SE and the drain DE may extend from the channel region AC in opposite directions from each other.

The first insulating layer 10 may be disposed on the buffer layer 10bf, and may cover the semiconductor layer. The first insulating layer 10 may be an inorganic layer. The first insulating layer 10 may include at least one of silicon oxide, silicon nitride, or silicon oxynitride. The first insulating layer 10, as well as the second to fifth insulating layers layer 20, 30, 40, and 50, may have a single-layer structure or a multi-layered structure, and may include at least one of the above materials, but the present disclosure is not limited thereto.

A gate GT of the of the second transistor T2 may be disposed on the first insulating layer 10. For example, a portion (e.g., a portion overlapping with the channel region AC) of the i-th scan line GWLi (e.g., refer to FIG. 4) may be the gate GT of the second transistor T2. The gate GT may overlap with the channel region AC.

The gate GT may be used as a mask covering the channel region AC in a process of doping the semiconductor layer. The gate GT may include molybdenum (Mo), an alloy containing molybdenum, titanium (Ti), or an alloy containing titanium, which has good heat resistance. The second insulating layer 20 may be disposed on the first insulating layer 10, and the second insulating layer 20 may cover the gate GT.

The third insulating layer 30, the fourth insulating layer 40, the fifth insulating layer 50, the first organic insulating layer 60, and the second organic insulating layer 70 may be sequentially disposed on the second insulating layer 20. However, the present disclosure is not limited thereto, and the number of insulating layers according to one or more embodiments of the present disclosure may be variously modified without any particular limitation in number.

The first organic insulating layer 60 may remove a step (e.g., a step difference) of the fifth insulating layer 50 disposed under the first organic insulating layer 60, and may form a flat or substantially flat upper surface. Each of the first organic insulating layer 60 and the second organic insulating layer 70 may include: a general purpose polymer, such as benzocyclobutene (BCB), polyimide, hexamethyldisiloxane (HMDSO), polymethylmethacrylate (PMMA), or polystyrene (PS); a polymer derivative having a phenolic group; an acrylic polymer; an imide-based polymer; an acryl ether polymer; an amide-based polymer; a fluorine-based polymer; a p-xylene-based polymer; a vinyl alcohol-based polymer; or a suitable blend thereof.

The light emitting element layer 130 may be disposed on the circuit layer 120. The light emitting element layer 130 may include the light emitting element ED. The light emitting element ED may include a first electrode AE, an emission layer EML, and the second electrode CE.

The first electrode AE may be disposed on the second organic insulating layer 70. The first electrode AE may be a transparent electrode, a semi-transparent electrode, or a reflective electrode. The first electrode AE may include a reflective layer formed of Ag, Mg, Al, Pt, Pd, Au, Ni, Nd, Ir, Cr, or a suitable compound thereof, and a transparent or semi-transparent electrode layer formed on the reflective layer. The transparent or semi-transparent electrode layer may include at least one selected from the group consisting of indium tin oxide (ITO), indium zinc oxide (IZO), indium gallium zinc oxide (IGZO), zinc oxide (ZnO), indium oxide ($In_2O_3$), and aluminum-doped zinc oxide (AZO). For example, the first electrode AE may include a three-layered structure of ITO/Ag/ITO, but the present disclosure is not limited thereto.

A pixel defining layer PDL may be disposed on the second organic insulating layer 70. The pixel defining layer PDL may have a transparent property, or may have a property of absorbing light. For example, the pixel defining layer PDL having the property for absorbing light may include a black coloring agent. The black coloring agent may include a black dye or a black pigment. The black coloring agent may include a metal, such as carbon black or chrome, or an oxide thereof. The pixel defining layer PDL may correspond to a light blocking pattern having a light blocking characteristic.

The pixel defining layer PDL may cover a portion of the first electrode AE. For example, an opening PDL-OP that exposes a portion of the first electrode AE may be defined in (e.g., may penetrate) the pixel defining layer PDL. The pixel defining layer PDL may increase a distance between an edge of the first electrode AE and the second electrode CE. Accordingly, the pixel defining layer PDL may prevent or substantially prevent an arc from being caused at the edge of the first electrode AE.

In some embodiments, a hole transport layer may be further interposed between the first electrode AE and the emission layer EML. In some embodiments, a hole injection layer may also be interposed between the first electrode AE and the hole transport layer. In some embodiments, an electron transport layer may be interposed between the emission layer EML and the second electrode CE. In some embodiments, an electron injection layer may be further interposed between the electron transport layer and the second electrode CE.

The encapsulation layer 140 may be disposed on the light emitting element layer 130. The encapsulation layer 140 may protect the light emitting element layer 130 from foreign substances, such as moisture, oxygen, and/or dust particles. The encapsulation layer 140 may include at least one inorganic layer.

The encapsulation layer 140 may include an inorganic encapsulation layer 141, an organic encapsulation layer 142, and an inorganic encapsulation layer 143, which are sequentially stacked, but the layers constituting the encapsulation layer 140 are not limited thereto.

The inorganic encapsulation layers 141 and 143 may protect the light emitting element layer 130 from moisture and oxygen, and the organic encapsulation layer 142 may protect the light emitting element layer 130 from a foreign substance, such as dust particles. The inorganic encapsulation layers 141 and 143 may include a silicon nitride layer, a silicon oxynitride layer, a silicon oxide layer, a titanium oxide layer, or an aluminum oxide layer. The organic encapsulation layer 142 may include an acryl-based organic layer, but the present disclosure is not limited thereto.

Figure 7:
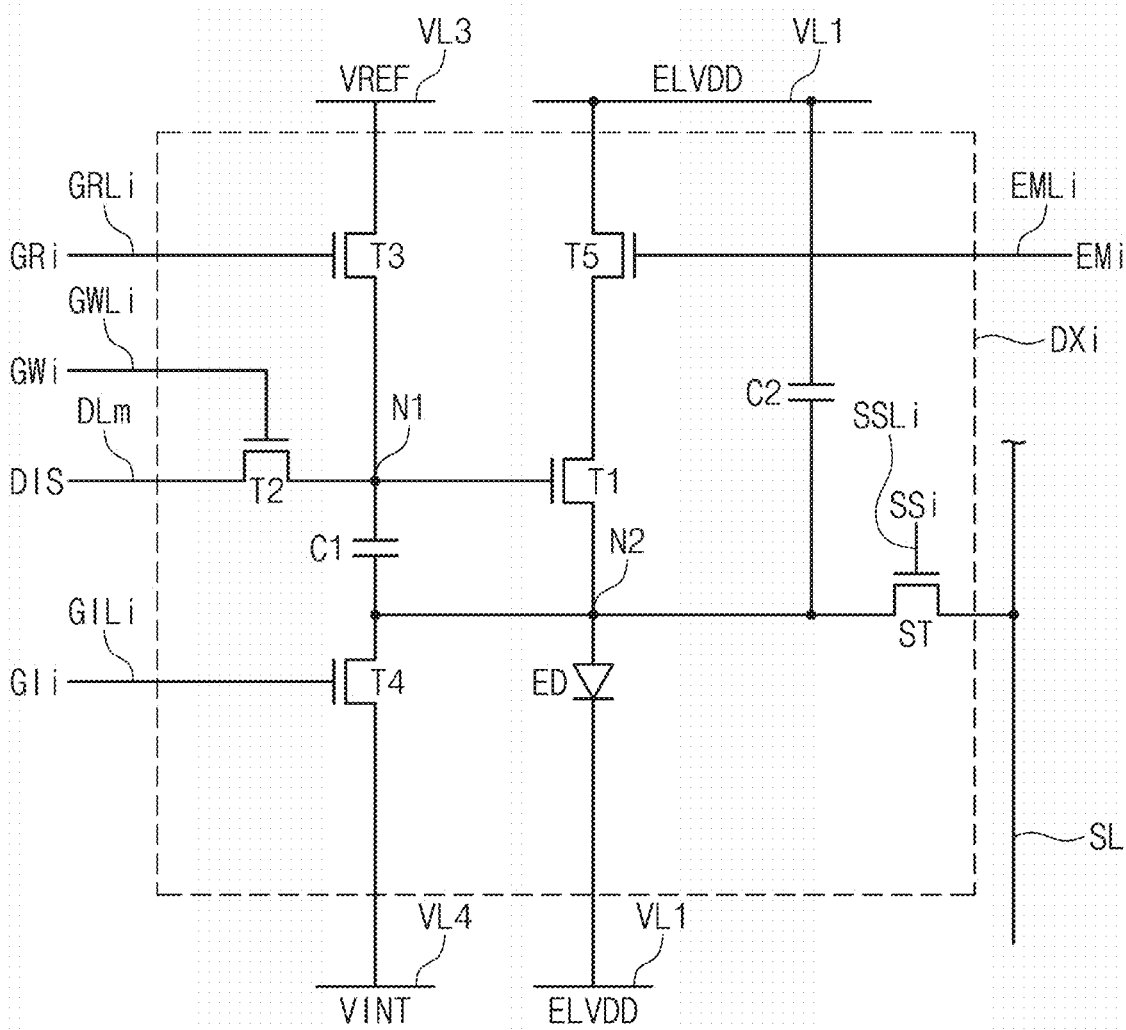
FIG. 7 is an equivalent circuit diagram of a dummy pixel according to an embodiment of the present disclosure.

FIG. 7 is an equivalent circuit diagram of a dummy pixel according to an embodiment of the present disclosure. In FIG. 7, the components that are the same or substantially the same as those described above with reference to FIG. 4 are provided with the same reference numerals/symbols, and thus, redundant description thereof may not be repeated.

A dummy pixel DXi connected to the i-th scan lines GILi, GRLi, and GWLi from among the scan lines GIL1 to GILn, GRL1 to GRLn, and GWL1 to GWLn (e.g., refer to FIG. 3), the i-th emission line EMLi from among the emission lines EML1 to EMLn, and the data line DLm is illustrated in FIG. 7 as an example.

Referring to FIG. 7, the dummy pixel DXi may include the light emitting element ED, the first transistor T1, the second transistor T2, the third transistor T3, the first capacitor C1, the fourth transistor T4, the fifth transistor T5, the second capacitor C2, and a sensing transistor ST.

The data line DLm may transfer a test data signal DIS. The test data signal DIS may be a data voltage for a degradation stress. The second transistor T2 may be connected between the data line DLm and the first node N1.

The sensing transistor ST may be connected between the second node N2 and the sensing line SL. The sensing transistor ST may include a source, a drain, a channel region, and a gate electrode. The gate electrode of the sensing transistor ST may be connected to a sensing control line SSLi. The gate electrode of the sensing transistor ST may receive a sensing signal SSi from the sensing control line SSLi. The sensing signal SSi may be provided from the scan driving circuit GDC (e.g., refer to FIG. 3). However, the present disclosure is not limited thereto, and the sensing signal SSi according to an embodiment of the present disclosure may be provided from any other suitable component.

The light emitting element ED may be connected between the second node N2 and the first voltage line VL1. The light emitting element ED may include a first electrode electrically connected to the second node N2, a second electrode for receiving the first power supply voltage ELVDD, and an emission layer interposed between the first electrode and the second electrode. However, the present disclosure is not limited thereto, and the second electrode of the dummy pixel DXi according to an embodiment of the present disclosure may be connected to the second voltage line VL2 to receive the second power supply voltage ELVSS.

Figure 8:
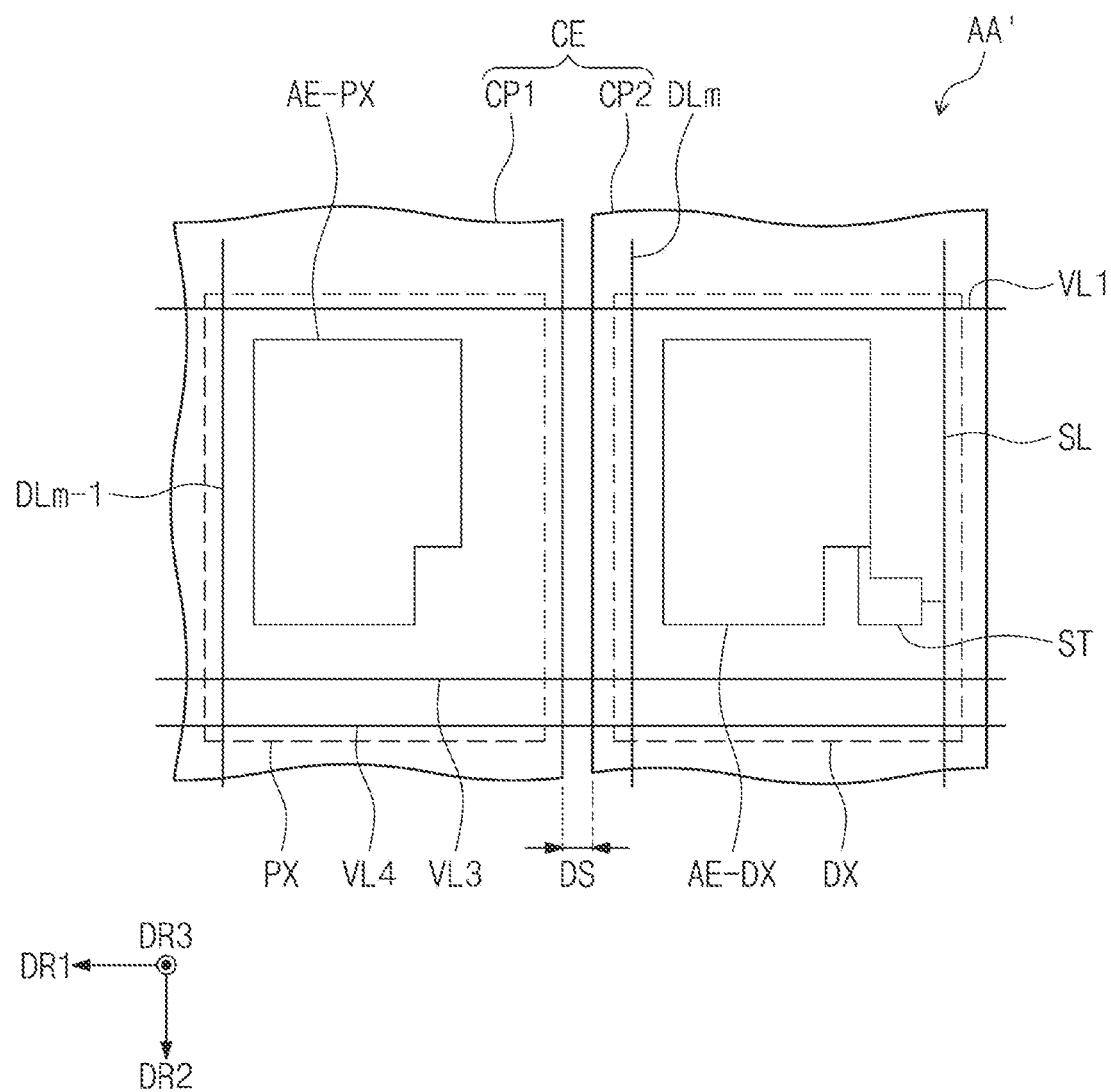
FIG. 8 is a plan view illustrating the area AA' of FIG. 3 according to an embodiment of the present disclosure.

FIG. 8 is a plan view illustrating the area AA' of FIG. 3 according to an embodiment of the present disclosure. One dummy pixel DX from among the plurality of dummy pixels DX1 to DXn (e.g., refer to FIG. 3), and one pixel PX that is adjacent to the dummy pixel DX from among the plurality of pixels PX11 to PXnm are illustrated in FIG. 8.

Referring to FIG. 8, the second electrode CE may include a first portion CP1 and a second portion CP2. The first portion CP1 and the second portion CP2 may be spaced apart from each other by as much as a first distance DS. The first portion CP1 and the second portion CP2 may be electrically insulated from each other.

The pixel PX may include a first electrode AE-PX. The pixel PX may be electrically connected to the data line DLm−1, the first voltage line VL1, the third voltage line VL3, and the fourth voltage line VL4.

In a plan view, the first portion CP1 may overlap with the first electrode AE-PX of the pixel PX. The first portion CP1 may be electrically connected to the first electrode AE-PX of the pixel PX.

The second power supply voltage ELVSS (e.g., refer to FIG. 4) may be provided to the first portion CP1.

The dummy pixel DX may include a first electrode AE-DX and the sensing transistor ST. The dummy pixel DX may be electrically connected to the data line DLm, the first voltage line VL1, the third voltage line VL3, the fourth voltage lines VL4, and the sensing line SL.

In a plan view, the second portion CP2 may overlap with the first electrode AE-DX of the dummy pixel DX. The second portion CP2 may be electrically connected to the first electrode AE-DX of the dummy pixel DX.

The first power supply voltage ELVDD (e.g., refer to FIG. 7) may be provided to the second portion CP2. The first power supply voltage ELVDD (e.g., refer to FIG. 7) may be provided to opposite ends of the first transistor T1 in the dummy pixel DX. The light emitting element ED (e.g., refer to FIG. 7) of the dummy pixel DX may not emit light.

According to one or more embodiments of the present disclosure, a characteristic of the pixel PX may change as an operation time passes. Because the dummy pixel DX experiences degradation under conditions similar to that of the pixel PX, the dummy pixel DX may be degraded similarly as that of (e.g., to be similar to) the pixel PX. The driving controller DC (e.g., refer to FIG. 2) may allow the dummy pixel DX to experience degradation independently, regardless of the operation of the pixel PX. The pixel PX and the dummy pixel DX may be driven concurrently (e.g., at the same time or substantially simultaneously). In other words, while the pixel PX displays the image IM (e.g., refer to FIG. 1), the dummy pixel DX may perform a degradation process or a measurement process. In this case, the first power supply voltage ELVDD (e.g., refer to FIG. 7) may be provided to the second portion CP2. The dummy pixel DX disposed in the active area AA (e.g., refer to FIG. 3) may be prevented from emitting light, so as to not be visually perceived from the outside. Accordingly, the display device DD (e.g., refer to FIG. 1) having an improved display quality may be provided.

Figure 9:
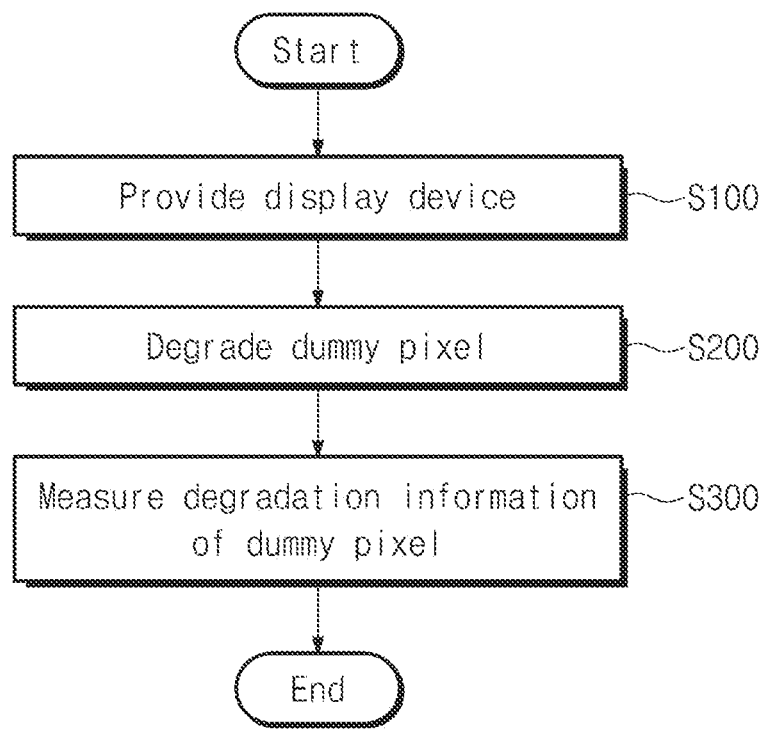
FIG. 9 is a flowchart illustrating a method of driving a display device, according to an embodiment of the present disclosure.

FIG. 9 is a flowchart illustrating a method of driving a display device, according to an embodiment of the present disclosure.

Referring to FIG. 9, the display device DD including the plurality of pixels PX11 to PXnm (e.g., refer to FIG. 3) and the plurality of dummy pixels DX1 to DXn may be provided (S100).

Each of the plurality of dummy pixels DX1 to DXn (e.g., refer to FIG. 3) may be degraded during a degradation time (e.g., a given or predetermined degradation time) (S200). As such, the plurality of dummy pixels DX1 to DXn (e.g., refer to FIG. 3) may be degraded artificially (or intentionally). This may be referred to as a degradation process or step S200. The degradation time may be 100 hours. The driving controller DC (e.g., refer to FIG. 2) may perform the degradation process of the dummy pixel DX during the degradation time independently regardless of the operation of the pixel PX.

While the degradation progresses, the first power supply voltage ELVDD (e.g., refer to FIG. 7) may be provided to the second portion CP2 (e.g., refer to FIG. 8). The plurality of dummy pixels DX1 to DXn (e.g., refer to FIG. 3) disposed in the active area AA may be prevented from emitting light, so as not to be visually perceived from the outside.

In the degradation process S200, the sensing line SL of each of the plurality of dummy pixels DX1 to DXn (e.g., refer to FIG. 3) may be electrically insulated from the degradation sensing circuit SIC (e.g., refer to FIG. 2). For example, in the degradation process S200, the sensing line SL of each of the plurality of dummy pixels DX1 to DXn (e.g., refer to FIG. 3) may be electrically connected to a ground electrode to which a ground voltage (e.g., Ground) is provided. In other words, while the degradation process S200 progresses, the degradation sensing circuit SIC (e.g., refer to FIG. 2) may not sense degradation information of each of the plurality of dummy pixels DX1 to DXn (e.g., refer to FIG. 3).

After the plurality of dummy pixels DX1 to DXn (e.g., refer to FIG. 3) are degraded, the degradation sensing circuit SIC (e.g., refer to FIG. 2) may measure the degradation information through the sensing line SL connected to each of the plurality of dummy pixels DX1 to DXn (S300). This may be referred to as a measurement process or step S300.

In the measurement process S300, the sensing line SL of each of the plurality of dummy pixels DX1 to DXn (e.g., refer to FIG. 3) may be electrically connected to the degradation sensing circuit SIC (e.g., refer to FIG. 2). In other words, while the measurement process S300 progresses, the degradation sensing circuit SIC (e.g., refer to FIG. 2) may sense the degradation information of the light emitting element ED by sensing the voltage of the first electrode of the light emitting element ED of each of the plurality of dummy pixels DX1 to DXn (e.g., refer to FIG. 3), or in other words, the voltage of the second node N2 connected to the first transistor T1.

The light emitting element ED (e.g., refer to FIG. 4) and the first transistor T1 of each of the plurality of pixels PX11 to PXnm (e.g., refer to FIG. 3) are degraded over time, and thus, the luminance of each pixel may decrease. The degradation of the plurality of pixels PX11 to PXnm (e.g., refer to FIG. 3) may be caused due to a change of a characteristic value (e.g., a threshold voltage, mobility, or luminance) over the driving time. Assuming that the plurality of dummy pixels DX1 to DXn (e.g., refer to FIG. 3) operate under the conditions similar to that of the plurality of pixels PX11 to PXnm, the plurality of dummy pixels DX1 to DXn may be degraded to be similar to the plurality of pixels PX11 to PXnm.

The degradation sensing circuit SIC may determine a compensation amount of data to be supplied to each of the plurality of pixels PX11 to PXnm disposed in the active area AA based on the degradation information. The degradation sensing circuit SIC may transmit a signal including information about a compensation amount to the driving controller DC.

The driving controller DC may transmit a signal for compensating for the data to be supplied to each of the plurality of pixels PX11 to PXnm to the data driving circuit DIC based on the determined compensation amount.

The data driving circuit DIC may output a data signal that is compensated based on the compensated data.

According to one or more embodiments of the present disclosure, in each of the plurality of pixels PX11 to PXnm, the compensation for the luminance may be made based on the compensated data signal. In other words, distribution compensation may be made appropriately by applying the distribution of each of the plurality of pixels PX11 to PXnm. Accordingly, the display device DD having an improved display quality, and the method of driving the display device may be provided.

As used in the present specification, distribution may refer to an error of each of a plurality of pixels that may be caused by a process distribution of a display panel.

Figure 10:
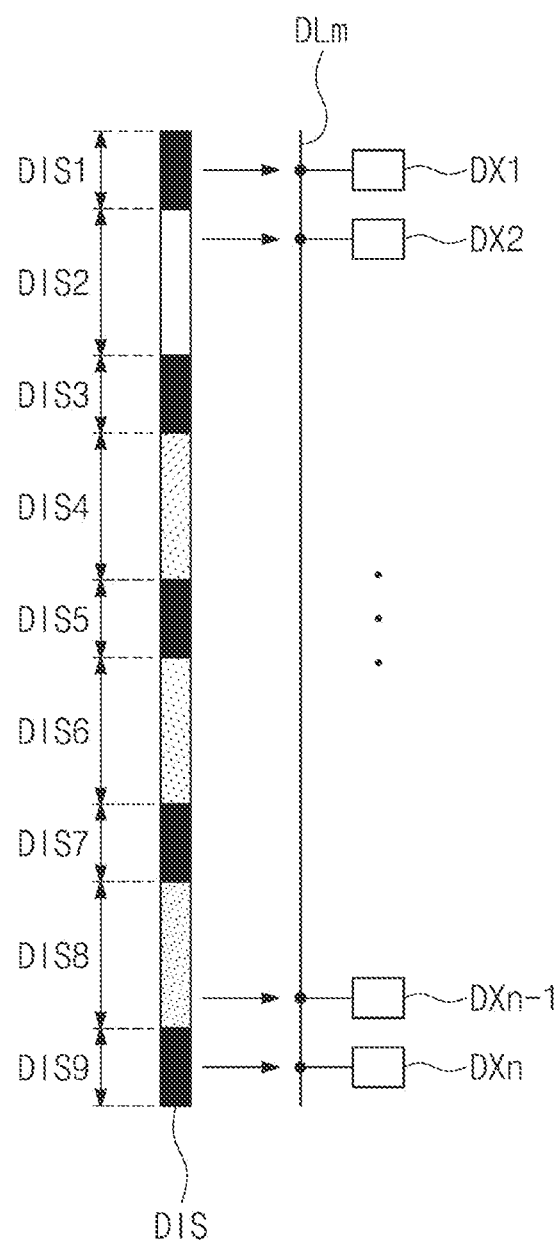
FIG. 10 is a diagram illustrating a data line to which a test data signal is provided and a plurality of dummy pixels, according to an embodiment of the present disclosure.

FIG. 10 is a diagram illustrating a data line to which a test data signal is provided and a plurality of dummy pixels, according to an embodiment of the present disclosure.

Referring to FIGS. 3, 9, and 10, in the degradation process S200, the data line DLm may receive the test data signal DIS from the data driving circuit DIC (e.g., refer to FIG. 2).

The test data signal DIS may be provided to the plurality of dummy pixels DX1, DX2 to DXn−1, and DXn. The plurality of dummy pixels DX1, DX2 to DXn−1, and DXn may include the first dummy pixel DX1, the second dummy pixel DX2, the (n−1)-th dummy pixel DXn−1, and the n-th dummy pixel DXn.

The test data signal DIS may include first to ninth degradation signals DIS1, DIS2, DIS3, DIS4, DIS5, DIS6, DIS7, DIS8, and DIS9. However, the present disclosure is not limited thereto, and the configuration of the test data signal DIS is not limited thereto.

The first degradation signal DIS1 may be a signal for displaying black (e.g., a black grayscale value). The first degradation signal DIS1 may be provided to the first dummy pixel DX1. During the degradation process S200, the first dummy pixel DX1 may operate by using the first degradation signal DIS1, and may experience degradation.

The second degradation signal DIS2 may be a signal for displaying a first grayscale (e.g., a first grayscale value). The second degradation signal DIS2 may be provided to the second dummy pixel DX2. During the degradation process S200, the second dummy pixel DX2 may operate by using the second degradation signal DIS2, and may experience degradation.

The third degradation signal DIS3 may be a signal for displaying black (e.g., a black grayscale value). The third degradation signal DIS3 may be provided to at least one of the plurality of dummy pixels DX1, DX2 to DXn−1, and DXn.

The fourth degradation signal DIS4 may be a signal for displaying a second grayscale (e.g., a second grayscale value) higher than the first grayscale. The fourth degradation signal DIS4 may be provided to at least one of the plurality of dummy pixels DX1, DX2 to DXn−1, and DXn.

The fifth degradation signal DIS5 may be a signal for displaying black. The fifth degradation signal DIS5 may be provided to at least one of the plurality of dummy pixels DX1, DX2 to DXn−1, and DXn.

The sixth degradation signal DIS6 may be a signal for displaying a third grayscale (e.g., a third grayscale value) higher than the second grayscale. The sixth degradation signal DIS6 may be provided to at least one of the plurality of dummy pixels DX1, DX2 to DXn−1, and DXn.

The seventh degradation signal DIS7 may be a signal for displaying black.

The seventh degradation signal DIS7 may be provided to at least one of the plurality of dummy pixels DX1, DX2 to DXn−1, and DXn.

The eighth degradation signal DIS8 may be a signal for displaying a fourth grayscale (e.g., a fourth grayscale value) higher than the third grayscale. The eighth degradation signal DIS8 may be provided to the (n−1)-th dummy pixel DXn−1. During the degradation process S200, the (n−1)-th dummy pixel DXn−1 may operate by using the eighth degradation signal DIS8, and may experience degradation.

The ninth degradation signal DIS9 may be a signal for displaying black. The ninth degradation signal DIS9 may be provided to the n-th dummy pixel DXn. During the degradation process S200, the n-th dummy pixel DXn may operate by using the ninth degradation signal DIS9, and may experience degradation.

In the measurement process S300, the degradation sensing circuit SIC may measure the degradation information from each of the plurality of dummy pixels DX1, DX2 to DXn−1, and DXn. In other words, the degradation sensing circuit SIC may extract the degradation information with regard to different grayscales (e.g., different grayscale values).

For example, based on the first dummy pixel DX1 and the second dummy pixel DX2, the degradation sensing circuit SIC may measure information about a pixel luminance according to a degradation time (e.g., information about a change of a pixel luminance over a degradation time), when the pixel is degraded by using the first grayscale compared to the black grayscale. As another example, based on the (n−1)-th dummy pixel DXn−1 and the n-th dummy pixel DXn, the degradation sensing circuit SIC may measure information about a pixel luminance according to a degradation time (e.g., information about a change of a pixel luminance over a degradation time), when the pixel is degraded by using the fourth grayscale compared to the black grayscale.

In other words, the degradation sensing circuit SIC may measure information about a pixel luminance according to a degradation time, for each of a plurality of grayscales (e.g., a plurality of grayscale values).

In an embodiment of the present disclosure, the voltage level of the test data signal DIS may be controlled, such that the degradation speed of the plurality of dummy pixels DX1, DX2 to DXn−1, and DXn is faster than the degradation speed of the plurality of pixels PX11 to PXnm.

According to one or more embodiments of the present disclosure, the degradation sensing circuit SIC may extract the degradation information for each grayscale (e.g., for each grayscale value). The distribution compensation may be made appropriately by applying each distribution to the plurality of pixels PX11 to PXnm (e.g., refer to FIG. 3). Accordingly, the display device DD (e.g., refer to FIG. 1) having an improved display quality, and the method of driving the display device may be provided.

Figure 11:
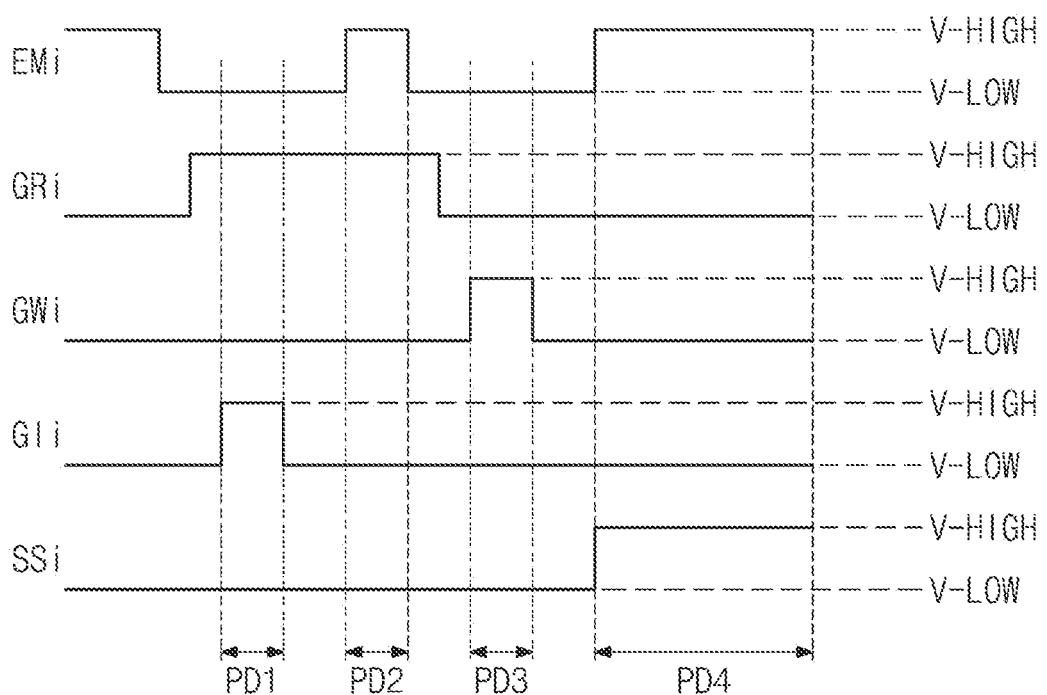
FIG. 11 is a waveform diagram of driving signals for driving a dummy pixel, according to an embodiment of the present disclosure.

FIG. 11 is a waveform diagram of driving signals for driving a dummy pixel, according to an embodiment of the present disclosure.

Referring to FIGS. 3, 7, 9, and 11, the display panel DP may be driven by using frame periods. FIG. 11 shows a portion of the frame period.

The frame period may include a first operation period PD1, a second operation period PD2, a third operation period PD3, and a fourth operation period PD4, which are continuous.

Each of the signals EMi, GRi, GWi, and GIi may have the high level V-HIGH during some periods, and may have the low level V-LOW during the other remaining periods. Each of the first to fifth transistors T1 to T5 may be N-type transistors as described above, and thus, may be turned on when the corresponding control signal has the high level V-HIGH. In this case, the high level V-HIGH may be referred to as an "active level", and the low level V-LOW may be referred to as an "inactive level".

During the first operation period PD1, the initialization scan signal GIi and the compensation scan signal GRi may be at the active level, and the emission signal EMi, the first scan signal GWi, and the sensing signal SSi may be at the inactive level. The third transistor T3 and the fourth transistor T4 may be turned on. The first node N1 may be initialized with the reference voltage VREF. The second node N2 may be initialized with the initialization voltage VINT. The first capacitor C1 may be initialized with a difference value of the reference voltage VREF and the initialization voltage VINT. The second capacitor C2 may be initialized with a difference value of the first power supply voltage ELVDD and the initialization voltage VINT. The first operation period PD1 may be a period that is the same or substantially the same as (e.g., identical or substantially identical to) the initialization period IP (e.g., refer to FIG. 5) in the driving operation of each of the plurality of pixels PX11 to PXnm.

During the second operation period PD2, the emission signal EMi and the compensation scan signal GRi may be at the active level, and the first scan signal GWi, the initialization scan signal GIi, and the sensing signal SSi may be at the inactive level. The third transistor T3 and the fifth transistor T5 may be turned on. A voltage corresponding to the threshold voltage of the first transistor T1 may be compensated for in the first capacitor C1. The second operation period PD2 may be a period that is the same or substantially the same as (e.g., identical or substantially identical to) the compensation period CP (e.g., refer to FIG. 5) in the driving operation of each of the plurality of pixels PX11 to PXnm.

During the third operation period PD3, the first scan signal GWi may be at the active level, and the emission signal EMi, the compensation scan signal GRi, the initialization scan signal GIi, and the sensing signal SSi may be at the inactive level. The second transistor T2 may be turned on. The second transistor T2 may output a voltage corresponding to the test data signal DIS. As a result, a voltage value corresponding to the test data signal DIS may be charged in the first capacitor C1. The test data signal DIS that experiences the compensation for the threshold voltage of the first transistor T1 may be charged in the first capacitor C1. The third operation period PD3 may be a period that is the same or substantially the same as (e.g., identical or substantially identical to) the write period WP in the driving operation of each of the plurality of pixels PX11 to PXnm.

During the fourth operation period PD4, the emission signal EMi and the sensing signal SSi may be at the active level, and the compensation scan signal GRi, the first scan signal GWi, and the initialization scan signal GIi may be at the inactive level. The fifth transistor T5 and the sensing transistor ST may be turned on. However, due to the first power supply voltage ELVDD provided to the second portion CP2 (e.g., refer to FIG. 8), the light emitting element ED of the dummy pixel DXi may not emit light. The fourth operation period PD4 may be a period that is the same or substantially the same as (e.g., identical or substantially identical to) the emission period in the driving operation of each of the plurality of pixels PX11 to PXnm.

According to the first operation period PD1, the second operation period PD2, the third operation period PD3, and the fourth operation period PD4, the dummy pixel DXi (e.g., refer to FIG. 7) may operate under the conditions similar to that of the pixel PXij (e.g., refer to FIG. 4), and thus, the dummy pixel DXi may be degraded to be similar to the pixel PXij.

In the degradation process S200, the sensing line SL of each of the plurality of dummy pixels DX1 to DXn may be electrically connected to the ground electrode to which the ground voltage is provided. In the degradation process S200, during the fourth operation period PD4, the degradation sensing circuit SIC may not sense the degradation information of each of the plurality of dummy pixels DX1 to DXn.

In the measurement process S300, the sensing line SL of each of the plurality of dummy pixels DX1 to DXn may be electrically connected to the degradation sensing circuit SIC. In the measurement process S300, during the fourth operation period PD4, the degradation sensing circuit SIC may sense the degradation information of the light emitting element ED.

Figure 12:
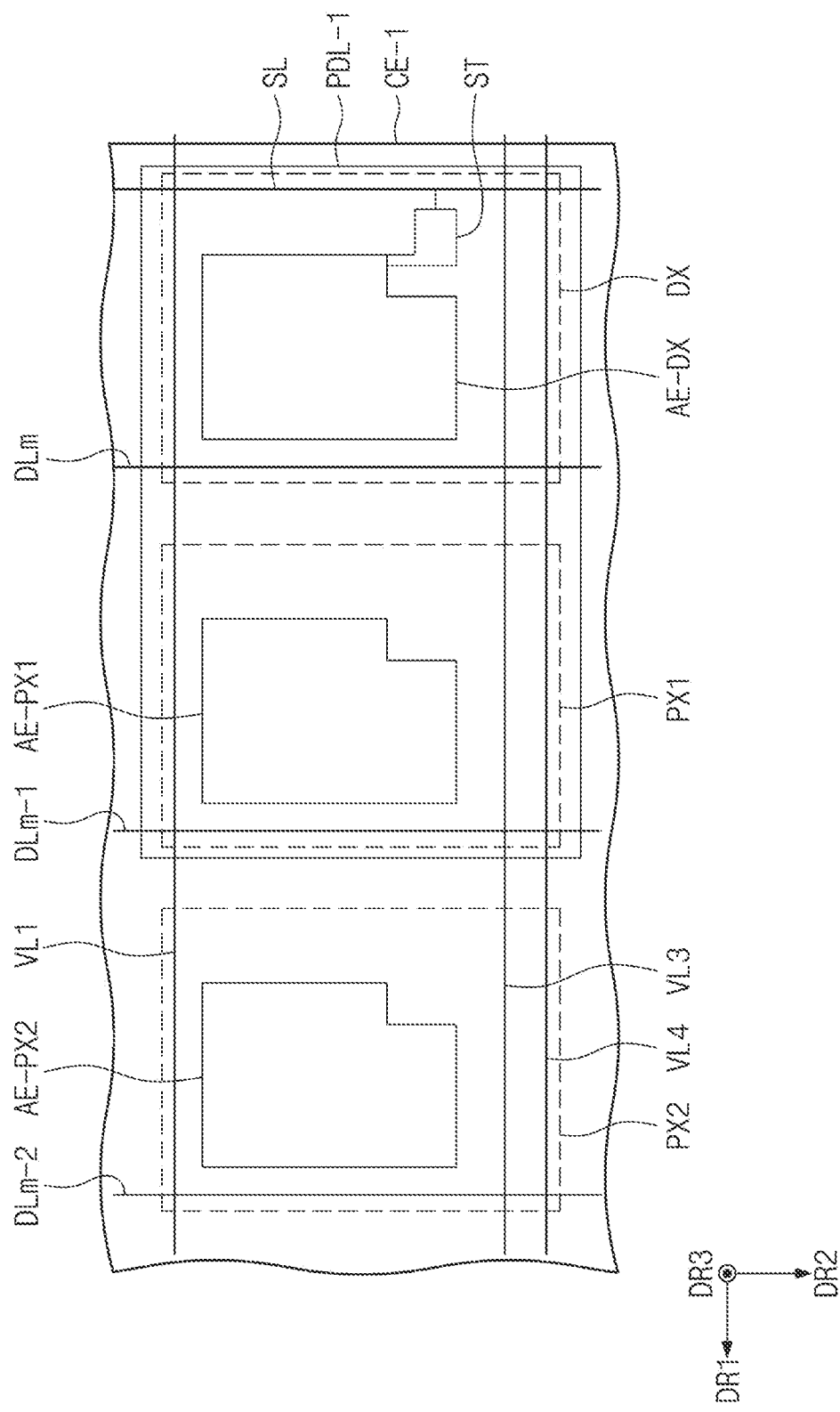
FIG. 12 is a plan view illustrating a portion of a display panel according to an embodiment of the present disclosure.

FIG. 12 is a plan view illustrating a portion of a display panel according to an embodiment of the present disclosure.

Figure 13:
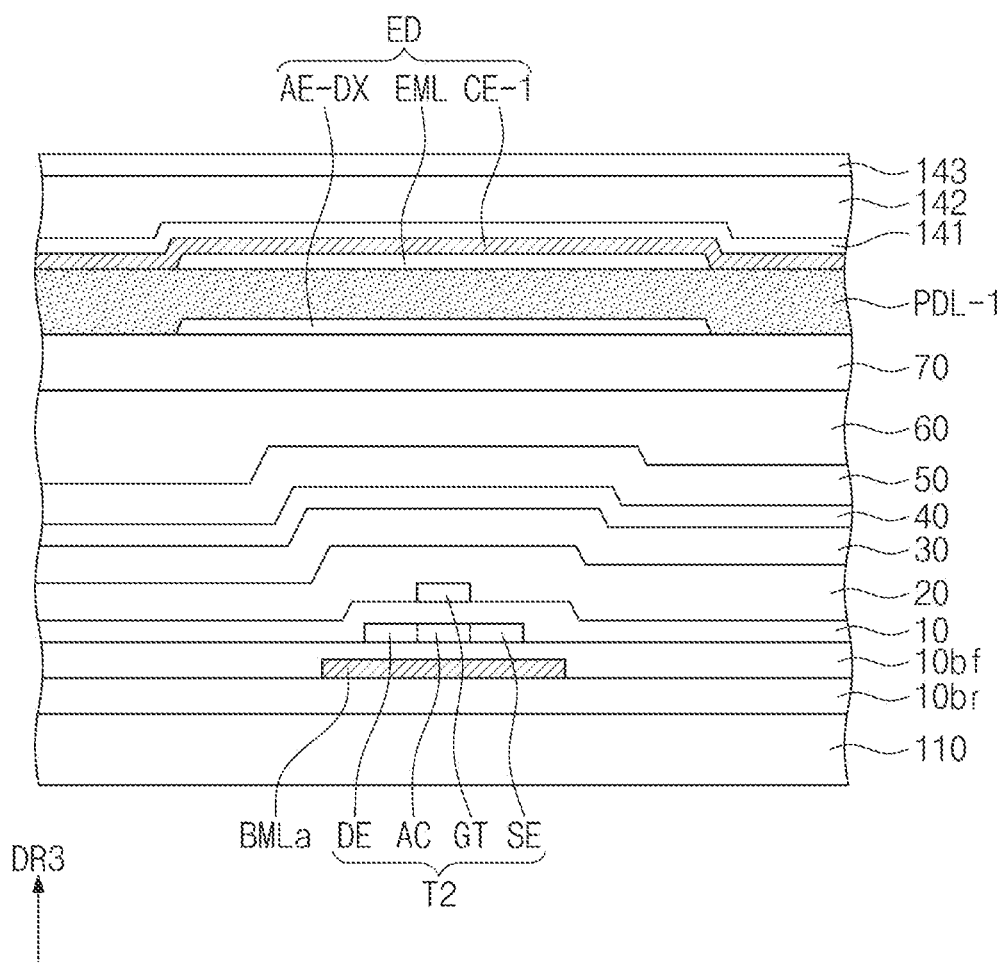
FIG. 13 is a cross-sectional view of a dummy pixel according to an embodiment of the present disclosure.

FIG. 13 is a cross-sectional view of a dummy pixel according to an embodiment of the present disclosure. For convenience, one dummy pixel DX from among the plurality of dummy pixels DX1 to DXn (e.g., refer to FIG. 3), and two pixels PX1 and PX2 adjacent to the dummy pixel DX from among the plurality of pixels PX11 to PXnm are illustrated in FIG. 12. FIG. 13 shows a cross section of a portion of the dummy pixel DX. In FIG. 13, the same or substantially the same components as those described above with reference to FIG. 6 are marked by the same reference numerals/symbols, and thus, redundant description thereof may not be repeated.

Referring to FIGS. 12 and 13, a second electrode CE-1 may be provided in one shape (e.g., may be commonly provided). In a plan view, the second electrode CE-1 may overlap with the active area AA (e.g., refer to FIG. 3).

The plurality of pixels PX1 and PX2 may include the first pixel PX1 adjacent to the dummy pixel DX, and the second pixel PX2 spaced apart from the dummy pixel DX with the first pixel PX1 interposed therebetween.

The first pixel PX1 may include a first electrode AE-PX1. The first pixel PX1 may be electrically connected to the data line DLm−1, the first voltage line VL1, the third voltage line VL3, and the fourth voltage line VL4.

In a plan view, the first electrode AE-PX1 of the first pixel PX1 may overlap with the second electrode CE-1.

A pixel defining layer PDL-1 may be interposed between the second electrode CE-1 and the first electrode AE-PX1 of the first pixel PX1. In a plan view, the pixel defining layer PDL-1 may overlap with the first electrode AE-PX1 and the second electrode CE-1. The pixel defining layer PDL-1 may cover the first electrode AE-PX1.

The second pixel PX2 may include a first electrode AE-PX2. The second pixel PX2 may be electrically connected to the data line DLm−2, the first voltage line VL1, the third voltage line VL3, and the fourth voltage line VL4.

In a plan view, the first electrode AE-PX2 of the second pixel PX2 may overlap with the second electrode CE-1. The second electrode CE-1 may be electrically connected to the first electrode AE-PX2 of the second pixel PX2.

In a plan view, at least a portion of the first electrode AE-PX2 of the second pixel PX2 may overlap with the second electrode CE-1. In an embodiment, the pixel defining layer PDL-1 disposed in the second pixel PX2 is not illustrated in FIG. 12, but the pixel defining layer PDL-1 may have the opening PDL-OP (e.g., refer to FIG. 6) corresponding to the emission layer EML of the second pixel PX2 as described above.

In other words, the pixel defining layer PDL-1 of the second pixel PX2 may have the same or substantially the same shape as that of the pixel defining layer PDL illustrated in FIG. 6.

The dummy pixel DX may include the first electrode AE-DX and the sensing transistor ST. The dummy pixel DX may be electrically connected to the data line DLm, the first voltage line VL1, the third voltage line VL3, the fourth voltage line VL4, and the sensing line SL.

The first electrode AE-DX may be disposed on the second organic insulating layer 70. In a plan view, the first electrode AE-DX of the dummy pixel DX may overlap with the second electrode CE-1.

The pixel defining layer PDL-1 may be disposed on the first electrode AE-DX and the second organic insulating layer 70. The pixel defining layer PDL-1 may cover the first electrode AE-DX.

The pixel defining layer PDL-1 may be interposed between the second electrode CE-1 and the first electrode AE-DX of the dummy pixel DX. In a plan view, the pixel defining layer PDL-1 may overlap with the first electrode AE-DX and the second electrode CE-1.

The pixel defining layer PDL-1 may have a property of absorbing light. For example, the pixel defining layer PDL-1 having the property of absorbing light may include a black coloring agent. The black coloring agent may include a black dye or a black pigment. The black coloring agent may include a metal, such as carbon black or chrome, or an oxide thereof. The pixel defining layer PDL-1 may correspond to a light blocking pattern having a light blocking characteristic.

The emission layer EML and the second electrode CE-1 may be disposed over the pixel defining layer PDL-1. The second power supply voltage ELVSS (e.g., refer to FIG. 4) may be provided to the second electrode CE-1.

According to one or more embodiments of the present disclosure, the driving controller DC (e.g., refer to FIG. 2) may perform the degradation process of the dummy pixel DX. The pixels PX1 and PX2 and the dummy pixel DX may be driven at the same or substantially at the same time. In this case, the pixel defining layer PDL-1 may prevent or substantially prevent the dummy pixel DX from emitting light. The dummy pixel DX disposed in the active area AA (e.g., refer to FIG. 3) may be prevented from emitting light, so as not to be visually perceived from the outside. Accordingly, the display device DD (e.g., refer to FIG. 1) having an improved display quality may be provided.

Figure 14:
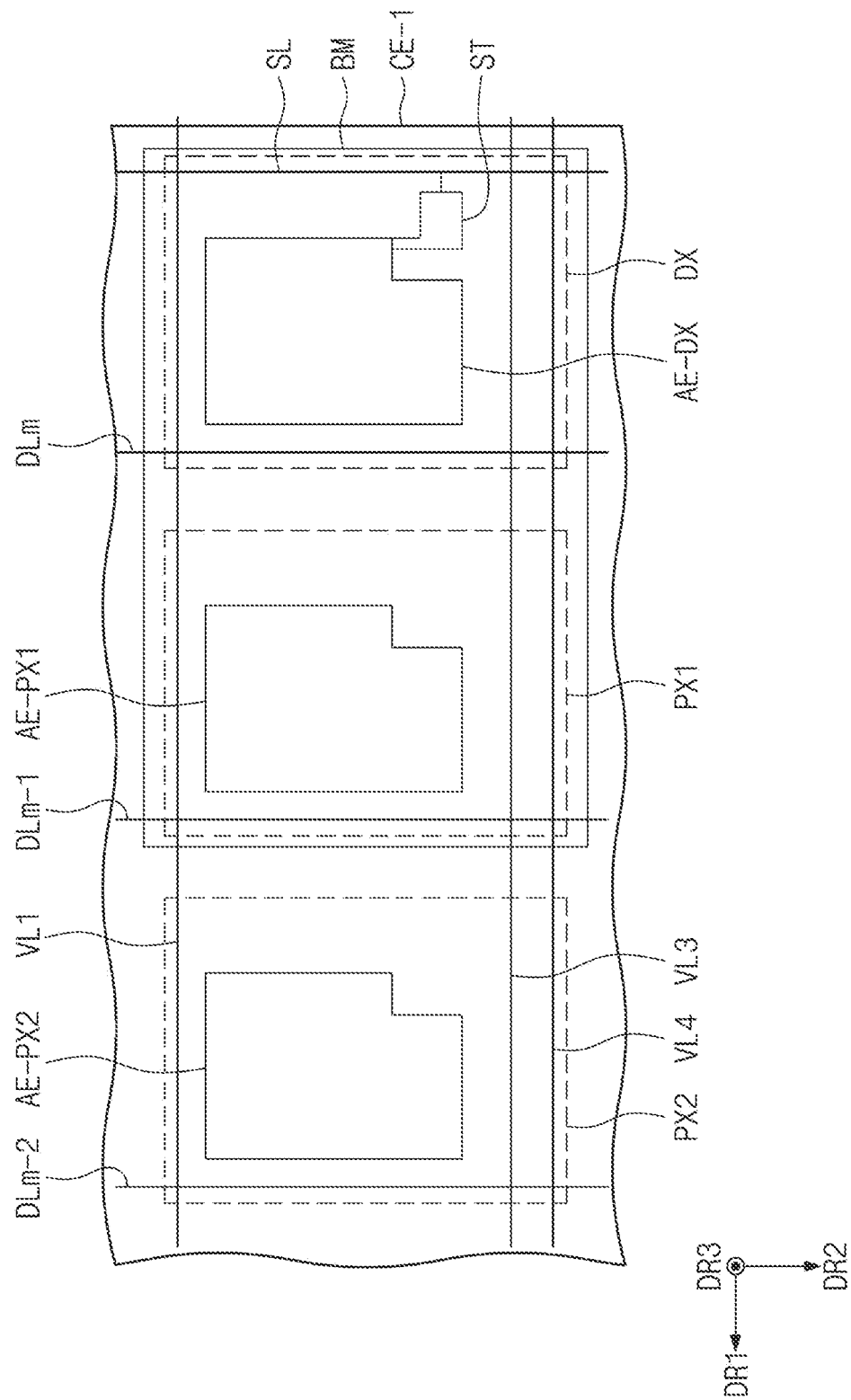
FIG. 14 is a plan view illustrating a portion of a display panel according to an embodiment of the present disclosure.
Figure 15:
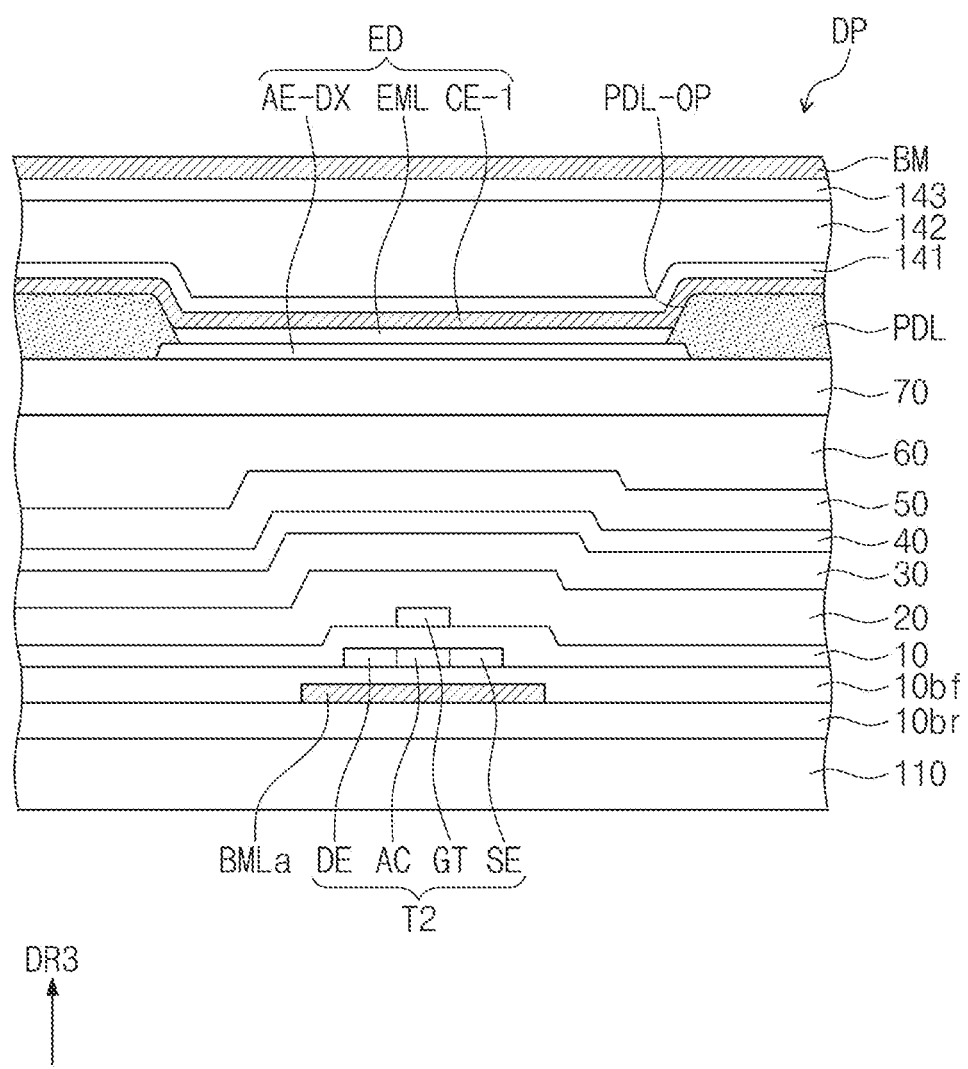
FIG. 15 is a cross-sectional view of a dummy pixel according to an embodiment of the present disclosure.

FIG. 14 is a plan view illustrating a portion of a display panel according to an embodiment of the present disclosure. FIG. 15 is a cross-sectional view of a dummy pixel according to an embodiment of the present disclosure. In FIG. 14, the same or substantially the same components as those described above with reference to FIG. 12 are marked by the same reference numerals/symbols, and thus, redundant description thereof may not be repeated. In FIG. 15, the same or substantially the same components as those described above with reference to FIG. 6 are marked by the same reference numerals/symbols, and thus, redundant description thereof may not be repeated.

Referring to FIGS. 14 and 15, the display panel DP may further include a black matrix layer BM. The black matrix layer BM may be disposed on the inorganic encapsulation layer 143 of the first pixel PX1. The black matrix layer BM may have a light blocking characteristic. In a plan view, the first electrode AE-PX1 may overlap with the black matrix layer BM.

In a plan view, the first electrode AE-PX2 of the second pixel PX2 may not overlap with the black matrix layer BM.

The black matrix layer BM may be disposed on the inorganic encapsulation layer 143 of the dummy pixel DX. In a plan view, the first electrode AE-DX may overlap with the black matrix layer BM.

The second power supply voltage ELVSS (e.g., refer to FIG. 4) may be provided to the second electrode CE-1.

According to one or more embodiments of the present disclosure, the driving controller DC (e.g., refer to FIG. 2) may perform the degradation operation of the dummy pixel DX. The pixels PX1 and PX2 and the dummy pixel DX may be driven at the same or substantially at the same time. In this case, the dummy pixel DX may emit light. The black matrix layer BM may be disposed over the first pixel PX1 and the dummy pixel DX. In a plan view, the black matrix layer BM may overlap with the first pixel PX1 and the dummy pixel DX. The black matrix layer BM may prevent light provided from the dummy pixel DX from being visually perceived from the outside. Also, the black matrix layer BM disposed over the first pixel PX1 adjacent to the dummy pixel DX may block light leaking out from the dummy pixel DX. In other words, the black matrix layer BM may prevent or substantially prevent a light leakage phenomenon in which the light provided from the dummy pixel DX leaks out. Accordingly, the display device DD (e.g., refer to FIG. 1) having an improved display quality may be provided.

According to one or more embodiments of the present disclosure as described above, each of the plurality of pixels may perform compensation processing on luminance, based on the compensated data signal. The degradation sensing circuit may extract the degradation information for each grayscale (e.g., each grayscale value). In other words, distribution compensation may be made appropriately by applying a distribution of each of the plurality of pixels. Accordingly, a display device having an improved display quality and a method of driving the display device may be provided.

According to one or more embodiments of the present disclosure as described above, as an operation time passes, the characteristic of the pixel may change. The dummy pixel may experience the degradation process under the condition similar to that of a pixel, such that the dummy pixel is degraded to be similar to the pixel. The driving controller may perform the degradation process of the dummy pixel independently regardless of the operation of the pixel. In other words, the pixel and the dummy pixel may be driven concurrently (e.g., at the same or substantially at the same time). In this case, the first power supply voltage may be provided to the second portion. The dummy pixel disposed in the active area may be prevented from emitting light, so as to not be visually perceived from the outside. Accordingly, a display device having an improved display quality may be provided.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the example embodiments of the present disclosure.

The foregoing is illustrative of some embodiments of the present disclosure, and is not to be construed as limiting thereof. Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display device comprising:
   a plurality of pixels in an active area, each of the plurality of pixels being electrically connected to a corresponding data line and a corresponding scan line; and
   a dummy pixel adjacent to at least one of the plurality of pixels, and electrically connected to the corresponding scan line and a sensing line,
   wherein each of the plurality of pixels and the dummy pixel comprises:
      a light emitting element including a first electrode electrically connected to a first node, a second electrode, and an emission layer between the first electrode and the second electrode;
      a first transistor electrically connected between a first voltage line for receiving a first power supply voltage and the first node, the first transistor including a source, a drain, and a gate, the gate of the first transistor being electrically connected to a second node;
      a second transistor electrically connected between the corresponding data line and the second node;
      a third transistor electrically connected between the second node and a second voltage line for receiving a first voltage;
      a first capacitor electrically connected between the first node and the second node;
      a fourth transistor electrically connected between a third voltage line for receiving a second voltage and the first node;
      a fifth transistor electrically connected between the first voltage line and the first transistor; and
      a second capacitor electrically connected between the first voltage line and the first node, and
   wherein the dummy pixel further comprises a sensing transistor electrically connected between the sensing line and the first node.

2. The display device of claim 1, wherein the second electrode comprises a first portion and a second portion spaced from the first portion,
   wherein, in a plan view, the first portion overlaps with the first electrode of each of the plurality of pixels, and
   wherein, in the plan view, the second portion overlaps with the first electrode of the dummy pixel.

3. The display device of claim 2, wherein the first portion is electrically connected to the first electrode of each of the plurality of pixels, and wherein the second portion is electrically connected to the first electrode of the dummy pixel.

4. The display device of claim 2, wherein the first portion and the second portion are electrically insulated from each other.

5. The display device of claim 2, wherein the first portion is configured to receive a second power supply voltage having a voltage level different from a voltage level of the first power supply voltage, and
wherein the second portion is configured to receive the first power supply voltage.

6. The display device of claim 2, wherein the light emitting element of the dummy pixel is configured to not emit light.

7. The display device of claim 1, wherein the dummy pixel is located in the active area.

8. The display device of claim 1, wherein:
the second transistor of the dummy pixel includes a gate electrode configured to receive a first scan signal;
the third transistor of the dummy pixel includes a gate electrode configured to receive a compensation scan signal;
the fourth transistor of the dummy pixel includes a gate electrode configured to receive an initialization scan signal;
the fifth transistor of the dummy pixel includes a gate electrode configured to receive an emission signal; and
the sensing transistor of the dummy pixel includes a gate electrode configured to receive a sensing signal.

9. The display device of claim 8, wherein, during a first operation period, the initialization scan signal and the compensation scan signal are at an active level.

10. The display device of claim 9, wherein, during a second operation period following the first operation period, the emission signal and the compensation scan signal are at the active level.

11. The display device of claim 10, wherein, during a third operation period following the second operation period, the first scan signal is at the active level.

12. The display device of claim 11, wherein, during a fourth operation period following the third operation period, the emission signal and the sensing signal are at the active level.

13. The display device of claim 1, wherein the dummy pixel comprises a plurality of dummy pixels,
wherein some of the plurality of dummy pixels are configured to receive a first degradation signal, and
wherein others of the plurality of dummy pixels are configured to receive a second degradation signal having a grayscale value different from a grayscale value of the first degradation signal.

14. The display device of claim 1, wherein the plurality of pixels comprises:
a first pixel adjacent to the dummy pixel; and
a second pixel spaced from the dummy pixel, with the first pixel located therebetween.

15. The display device of claim 14, wherein the second electrode of each of the plurality of pixels and the dummy pixel is configured to receive a second power supply voltage having a voltage level different from a voltage level of the first power supply voltage.

16. The display device of claim 15, further comprising a black matrix layer over the first pixel and the dummy pixel, and overlapping with the first pixel and the dummy pixel in a plan view.

17. The display device of claim 15, further comprising a pixel defining layer covering the emission layer of each of the first pixel and the dummy pixel,
wherein the pixel defining layer has an opening corresponding to the emission layer of the second pixel.

18. A display device driving method comprising:
providing a display device comprising:
a plurality of pixels, each comprising:
a driving transistor electrically connected between a first voltage line for receiving a first power supply voltage and a second node, and comprising a gate connected to a first node;
a third transistor electrically connected between the second node and a second voltage line for receiving a first voltage;
a fourth transistor electrically connected between a third voltage line for receiving a second voltage and the first node;
a fifth transistor electrically connected between the first voltage line and the driving transistor; and
a second capacitor electrically connected between the first voltage line and the first node;
a dummy pixel comprising:
a driving transistor;
a sensing transistor connected to the driving transistor of the dummy pixel; and
a sensing line connected to the sensing transistor; and
a degradation sensing circuit;
degrading the dummy pixel during a degradation time; and
measuring degradation information of the dummy pixel through the sensing line.

19. The display device driving method of claim 18, wherein the degradation time is 100 hours.

20. The display device driving method of claim 18, wherein, in the degrading of the dummy pixel, the sensing line is electrically insulated from the degradation sensing circuit, and
wherein, in the measuring of the degradation information, the sensing line is electrically connected to the degradation sensing circuit.

* * * * *